United States Patent
Shinohara

(10) Patent No.: US 12,074,188 B2
(45) Date of Patent: Aug. 27, 2024

(54) IMAGE SENSOR

(71) Applicant: SAMSUNG ELECTRONICS CO., LTD., Suwon-si (KR)

(72) Inventor: Takekazu Shinohara, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 463 days.

(21) Appl. No.: 17/385,245

(22) Filed: Jul. 26, 2021

(65) Prior Publication Data
US 2022/0190006 A1    Jun. 16, 2022

(30) Foreign Application Priority Data
Dec. 14, 2020 (KR) .................. 10-2020-0174406

(51) Int. Cl.
H01L 27/146    (2006.01)
(52) U.S. Cl.
CPC .... *H01L 27/1463* (2013.01); *H01L 27/14621* (2013.01); *H01L 27/14627* (2013.01)
(58) Field of Classification Search
None
See application file for complete search history.

(56) References Cited

U.S. PATENT DOCUMENTS

| | | | | |
|---|---|---|---|---|
| 8,541,857 B2* | 9/2013 | Ahn | ..................... | H01L 27/1461 257/466 |
| 9,484,380 B1* | 11/2016 | Hsieh | ................. | H01L 27/14685 |
| 9,876,044 B2* | 1/2018 | Lee | ..................... | H01L 27/1464 |
| 9,991,307 B2 | 6/2018 | Cheng et al. | | |
| 10,332,922 B2 | 6/2019 | Miyanami | | |
| 10,714,515 B2 | 7/2020 | Shinohara | | |
| 2007/0155083 A1* | 7/2007 | Park | .................. | H01L 27/14621 438/199 |
| 2011/0204467 A1* | 8/2011 | Ohchi | ................. | H01L 27/1463 438/57 |
| 2016/0043125 A1 | 2/2016 | Hatano | | |
| 2019/0312075 A1 | 10/2019 | Yamamoto et al. | | |
| 2019/0348458 A1 | 11/2019 | Jangjian et al. | | |
| 2020/0227467 A1 | 7/2020 | Yokogawa | | |
| 2021/0272996 A1* | 9/2021 | Tsao | ..................... | H01L 27/1463 |

FOREIGN PATENT DOCUMENTS

JP    2001-250931 A    9/2001

* cited by examiner

*Primary Examiner* — Ali Naraghi
(74) *Attorney, Agent, or Firm* — Sughrue Mion, PLLC

(57) ABSTRACT

An image sensor includes a pixel separation structure disposed in a semiconductor substrate and defining a plurality of pixel regions, a first photoelectric conversion region and a second photoelectric conversion region disposed in the semiconductor substrate and in each of the plurality of pixel regions, and a plurality of micro-lenses disposed on the semiconductor substrate and corresponding to the plurality of pixel regions. The semiconductor substrate includes a plurality of curved surfaces that is convex toward the plurality of micro-lenses, and the semiconductor substrate has a minimum thickness between the first photoelectric conversion region and the second photoelectric conversion region in each of the plurality of pixel regions, and has a maximum thickness at a boundary between the plurality of pixel regions.

11 Claims, 24 Drawing Sheets

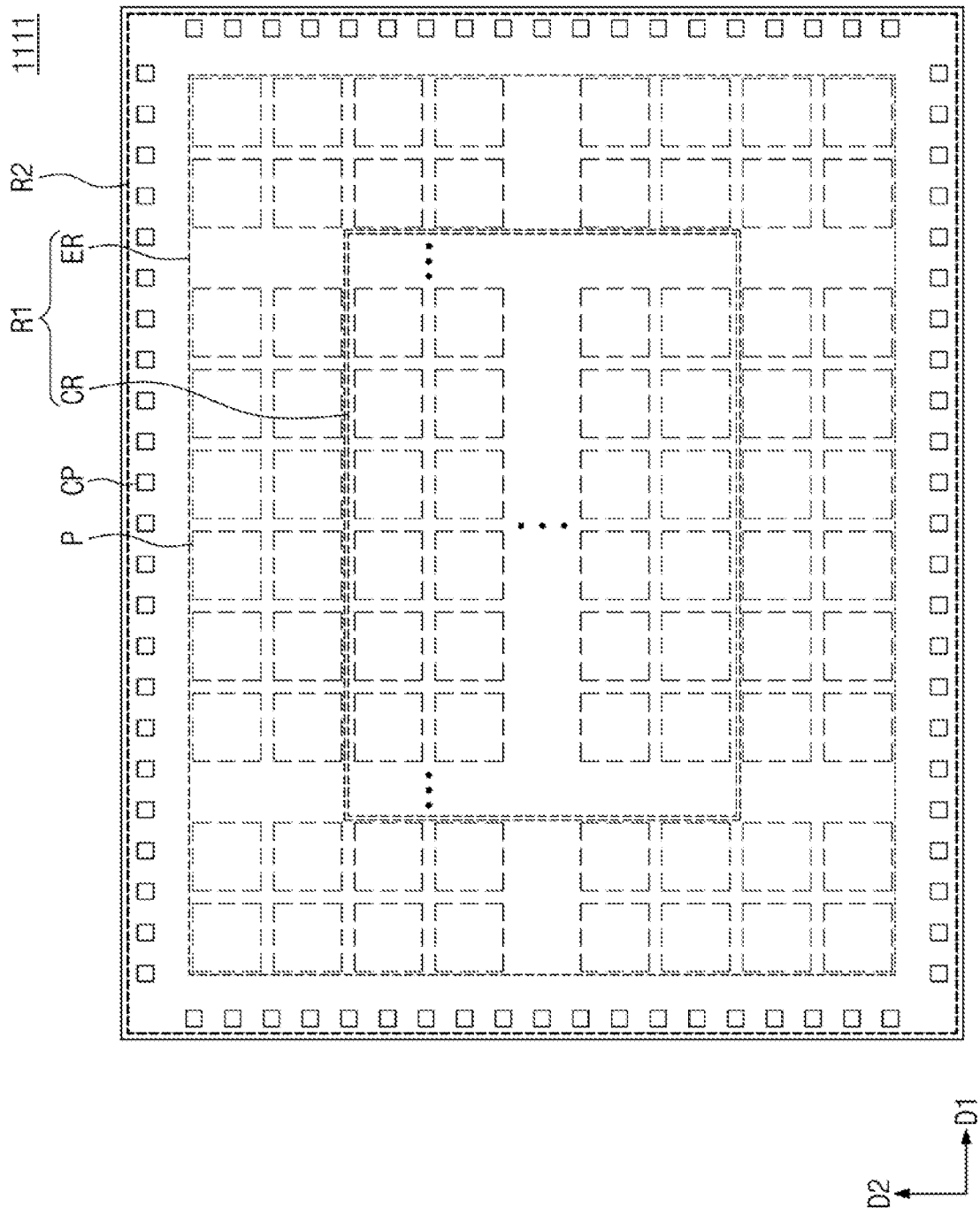

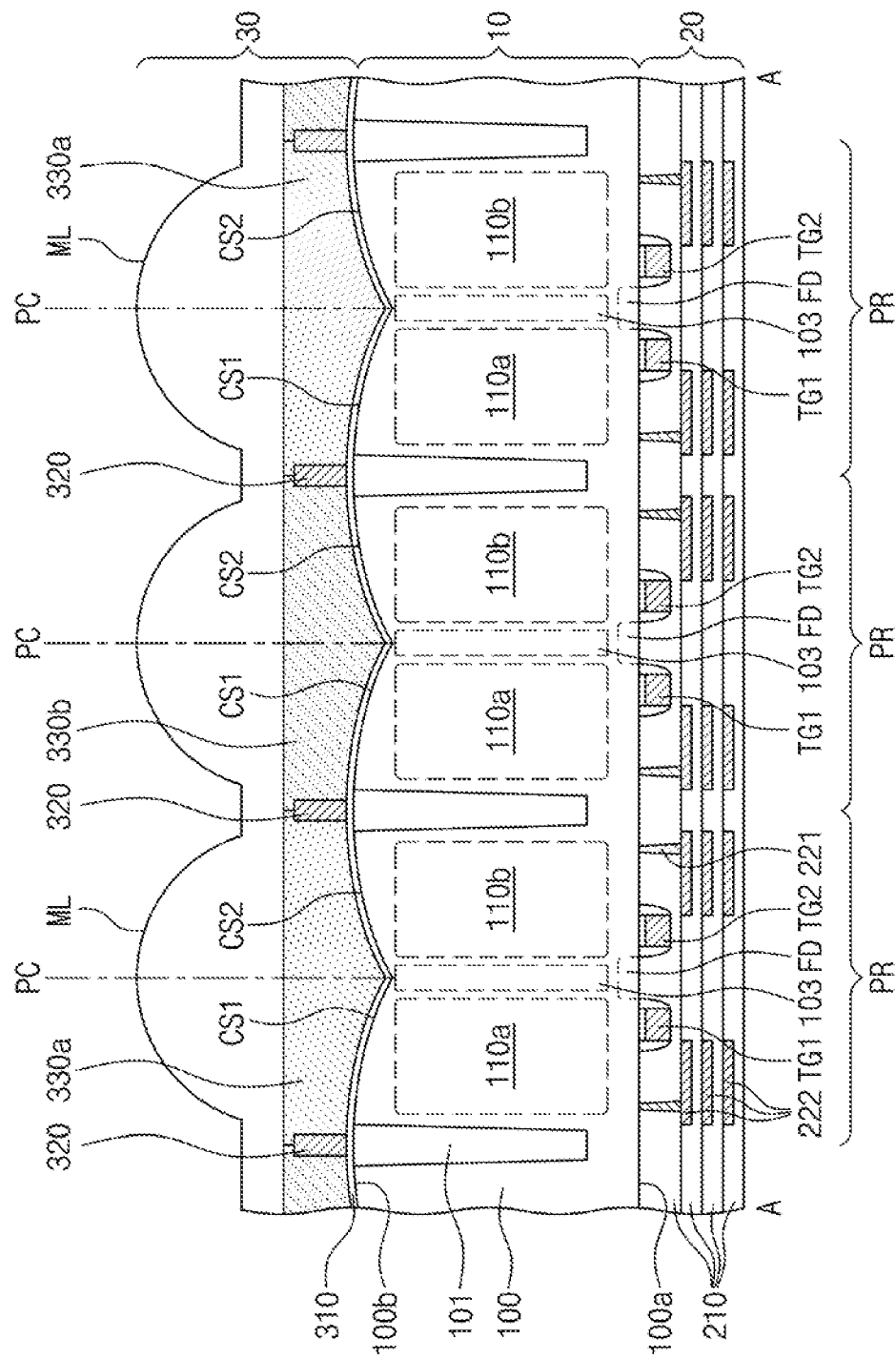

IMAGE SENSOR

CROSS-REFERENCE TO RELATED APPLICATION

This application is based on and claims priority under 35 U.S.C. § 119 to Korean Patent Application No. 10-2020-0174406, filed on Dec. 14, 2020, in the Korean Intellectual Property Office, the disclosure of which is incorporated by reference herein in its entirety.

BACKGROUND

The disclosure relates to an image sensor, and more particularly, to an image sensor that provides an autofocus operation.

An image sensor converts photonic images into electrical signals. Recent advances in computer and communication industries have led to strong demands in high performances image sensors in various consumer electronic devices such as digital cameras, camcorders, PCSs (personal communication systems), game consoles, security cameras, and medical micro-cameras.

An image sensor may be classified into a charged coupled device (CCD) or a CMOS image sensor. The CMOS image sensor has a simple operating method, and a size of its product may be possibly minimized because its signal processing circuit is integrated into a single chip. Also, the CMOS image sensor may require relatively small power consumption, which may be used in battery-powered application. In addition, because process technology of manufacturing CMOS image sensors is compatible with CMOS process technology, the CMOS image sensors can decrease in fabrication cost. Accordingly, the use of the CMOS image sensor has been rapidly increasing as a result of advances in technology and implementation of high resolution.

SUMMARY

Provided is an image sensor with improved optical and electrical characteristics.

The object of the inventive concepts is not limited to the mentioned above, and other objects that have not been mentioned above will be clearly understood to those skilled in the art from the following description.

According to embodiments, an image sensor includes a pixel separation structure disposed in a semiconductor substrate and defining a plurality of pixel regions, a first photoelectric conversion region and a second photoelectric conversion region disposed in the semiconductor substrate and in each of the plurality of pixel regions, and a plurality of micro-lenses disposed on the semiconductor substrate and corresponding to the plurality of pixel regions. The semiconductor substrate includes a plurality of curved surfaces that is convex toward the plurality of micro-lenses, and the semiconductor substrate has a minimum thickness between the first photoelectric conversion region and the second photoelectric conversion region in each of the plurality of pixel regions, and has a maximum thickness at a boundary between the plurality of pixel regions.

According to embodiments, an image sensor includes a semiconductor substrate including a front surface and a rear surface, a pixel separation structure disposed in the semiconductor substrate and defining a pixel region, a first photoelectric conversion region and a second photoelectric conversion region disposed in the pixel region, and a micro-lens corresponding to the pixel region and disposed on the rear surface of the semiconductor substrate. The rear surface of the semiconductor substrate includes a first curved surface and a second curved surface respectively corresponding to the first photoelectric conversion regions and the second photoelectric conversion region, and the first curved surface is mirror-symmetrical to the second curved surface.

According to embodiments, an image sensor includes a semiconductor substrate including a front surface and a rear surface, a pixel separation structure disposed in the semiconductor substrate and defining a plurality of pixel regions, and a first photoelectric conversion region and a second photoelectric conversion region disposed in the semiconductor substrate and in each of the plurality of pixel regions. The image sensor further includes a plurality of micro-lenses disposed on the rear surface of the semiconductor substrate and corresponding to the plurality of pixel regions, a plurality of color filters interposed between the plurality of micro-lenses and the semiconductor substrate, the color filters corresponding to the plurality of pixel regions, a grid structure interposed between the plurality of color filters, and a plurality of readout circuits disposed on the front surface of the semiconductor substrate and connected to the first photoelectric conversion regions and the second photoelectric conversion region. The rear surface of the semiconductor substrate includes a first curved surface and a second curved surface respectively corresponding to the first photoelectric conversion region and the second photoelectric conversion region, and the first curved surface is mirror-symmetrical to the second curved surface.

BRIEF DESCRIPTION OF THE DRAWINGS

FIG. 4 illustrates a simplified plan view showing an image sensor according to embodiments.

FIGS. 6B and 6C illustrate cross-sectional views taken along line A-A' of FIG. 6A, showing an image sensor according to embodiments.

DETAILED DESCRIPTION

The following will now describe in detail an image sensor according to embodiments in conjunction with the accompanying drawings.

Figure 1:
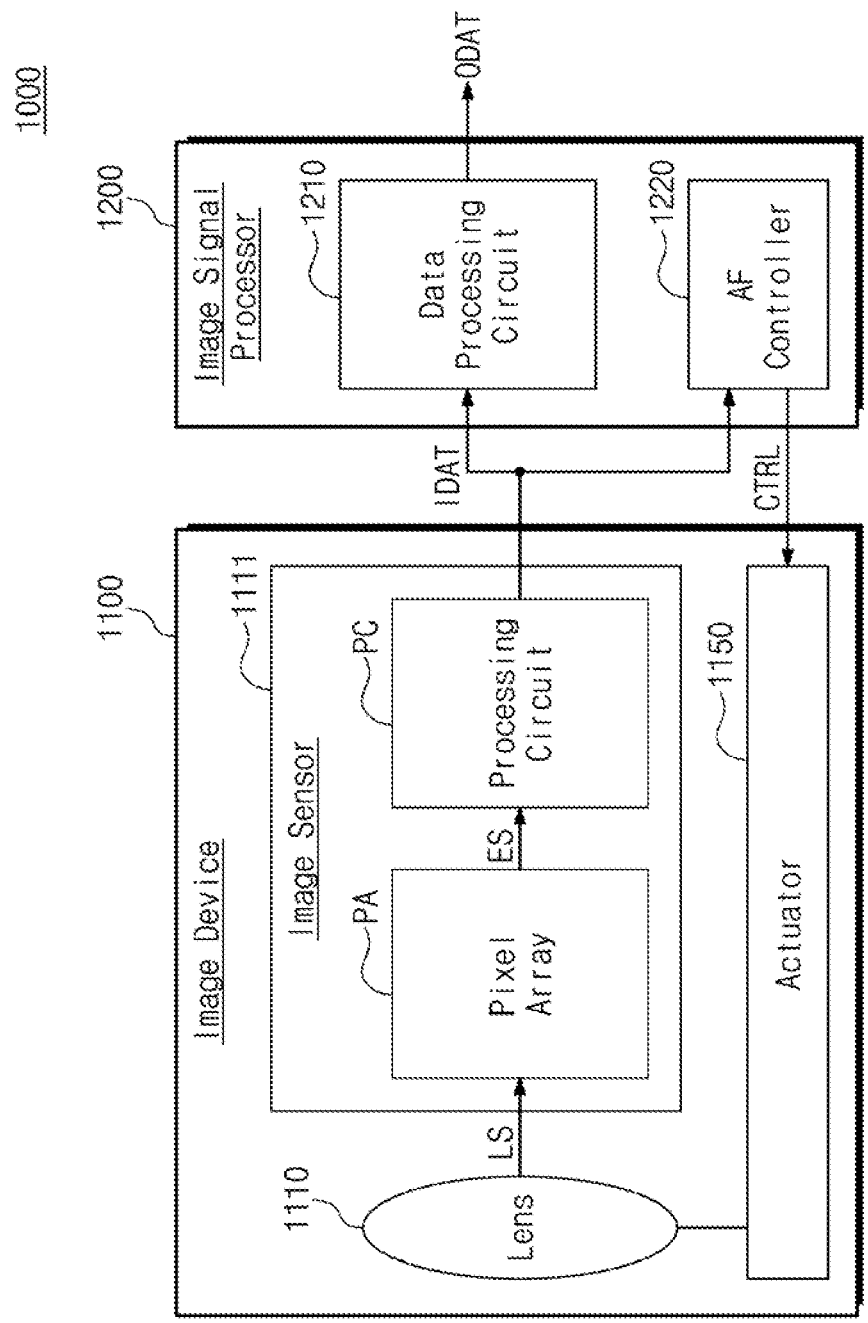
FIG. 1 illustrates a block diagram showing an image sensor according to embodiments.

FIG. 1 illustrates a block diagram showing an image sensor according to embodiments.

Referring to FIG. 1, an image system 1000 may include an image device 1100 and an image signal processor (ISP) 1200. For example, the image system 1000 may be one of various electronic apparatuses, such as smart phones, tablet PCs, and digital cameras, capable of obtaining image information about external objects.

The image device 1100 may include a lens 1110, an image sensor 1111, and an actuator 1150. The image sensor 1111 may include a pixel array PA and a processing circuit PC.

The lens 1110 may receive light LS that is incident after being reflected from an external object. The lens 1110 may concentrate the incident light LS on the pixel array PA. The lens 1110 may move in accordance with an operation of the actuator 1150. When a position of the lens 1110 is changed due to the movement of the lens 1110, the lens 1110 may have a variation in focal length. Therefore, the lens 1110 may be controlled to focus on an object. For example, the actuator 1150 may be an autofocus motor.

The pixel array PA may include a plurality of pixels. When the pixel array PA receives the light LS delivered through the lens 1110, a photoelectric conversion element may convert the light LS into an electrical signal ES. The processing circuit PC may be provided with the electrical signal ES that is output from the pixel array PA.

The processing circuit PC may convert the electrical signal ES, or an analog signal, into a digital signal. Therefore, an image data DAT output from the processing circuit PC may be a digital signal. The processing circuit PC may perform various signal processing operations in addition to the analog-digital conversion. For example, the processing circuit PC may perform a correlated double sampling (CDS) for extracting effective signal components.

The processing circuit PC may output the image data IDAT generated by performing various signal processing operations on the electrical signal ES. The output image data IDAT may be provided to the image signal processor 1200.

A data processing circuit 1210 may process the image data IDAT to generate an output data ODAT. For example, the data processing circuit 1210 may perform various data processing operations on the image data IDAT, such as lens shading correction, white balance, noise reduction, sharpening, gamma correction, and color conversion. The output data ODAT may be provided to a separate processor or a display device.

An autofocus (AF) controller 1220 may detect a phase difference of the light LS incident on pixels of the pixel array PA, and may use the detected phase difference to generate a control signal CTRL for autofocus.

For example, the autofocus controller 1220 may calculate a disparity based on the image data IDAT of an autofocus-target object. The disparity may indicate a difference in coordinate between two image data IDAT obtained from the object. For example, the autofocus controller 1220 may calculate a disparity by comparing a left image data IDAT and a right image data IDAT obtained from the object. Based on the calculated disparity, the autofocus controller 1220 may determine a movement distance of the lens 1110 for autofocus. The autofocus controller 1220 may generate the control signal CTRL to cause the lens 1110 to move to a position that corresponds to the determined movement distance. The generated control signal CTRL may be provided to the actuator 1150. In this case, the actuator 1150 may drive the lens 1110 to move to a corresponding position in response to the control signal CTRL. For example, the control signal CTRL may be used as a signal for autofocus operations to adjust positions of the lens 1110 in the image device 1100 including the image sensor 1111.

According to embodiments, an autofocus operation may be performed based on a way to detect phase differences in various regions of an image captured through the lens 1110. For example, the autofocus operation may be performed either on a central region of the image or on a peripheral region of the image. According to embodiments, the autofocus operation may be performed based on the way to detect phase differences in an entire region of the image. Therefore, it may be possible to increase sharpness of the peripheral region as well as the central region of the image and to promptly focus the peripheral region.

Figure 2:
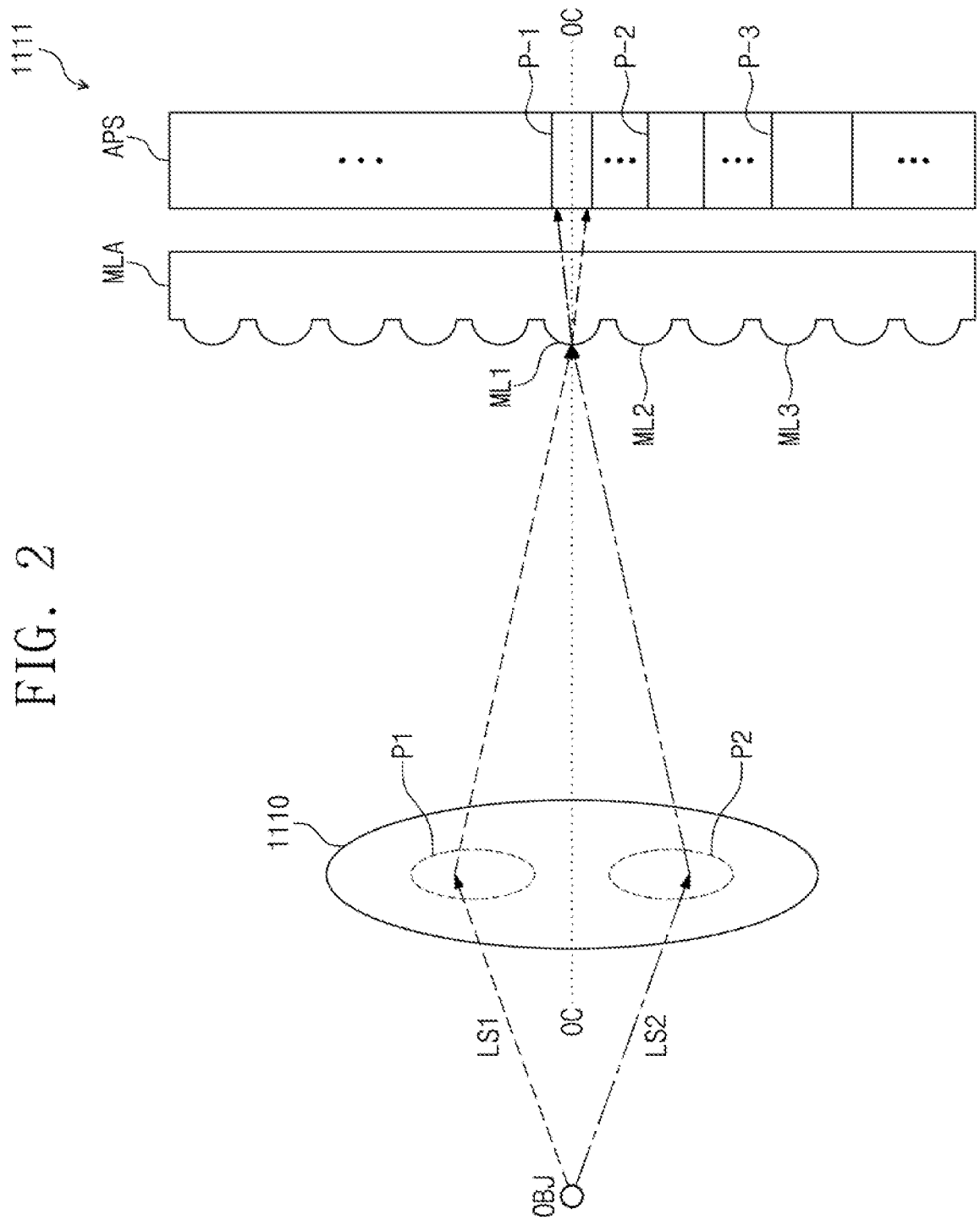
FIG. 2 illustrates a diagram showing an autofocus operation of an image sensor according to embodiments.

FIG. 2 illustrates a diagram showing an autofocus operation of an images sensor according to embodiments.

Referring to FIG. 2, an active pixel sensor array APS may include a plurality of pixels P (e.g., P-1, P-2, P-3, etc.). Each of the pixels P may include at least two photoelectric conversion elements. A micro-lens array MLA may include micro-lenses ML (e.g., ML1, ML2, ML3, etc.) that correspond to the pixels P.

The lens 1110 may receive a first light LS1 and a second light LS2 that are reflected from an object OBJ. The first light LS1 may be received through a pupil P1 above an optical axis OC, and the second light LS2 may be received through a pupil P2 below the optical axis OC. For example, the first light LS1 may include image information about the object OBJ collected in a first direction (or a direction where the pupil P1 is placed), and the second light LS2 may include image information about the object OBJ collected in a second direction (or a direction where the pupil P2 is placed). When the lens 1110 is out of focus with respect to the object OBJ, the first light LS1 may have a phase different from that of the second light LS2.

The first light LS1 and the second light LS2 may be refracted through the lens 1110, and may be transmitted to the micro-lens ML that corresponds to a position of the object OBJ. The first light LS1 and the second light LS2 incident on the micro-lens ML may be refracted through the micro-lens ML, and may be transmitted to the pixel P that corresponds to the micro-lens ML. The first light LS1 and the second light LS2 incident on the micro-lens ML may be separated from each other depending on incident angles, and may be incident on the pixel P. For example, the first light LS1 may be incident on a first photoelectric conversion element of the pixel P, and the second light LS2 may be incident on a second photoelectric conversion element of the pixel P.

As such, when the first light LS1 and the second light LS2 are separated and received depending on incident angles, it may be possible to generate an image data of the object OBJ viewed in different directions. In this case, a disparity may be calculated based on the generated image data, and an autofocus operation of phase difference detection may be performed based on the calculated disparity.

Figure 3:
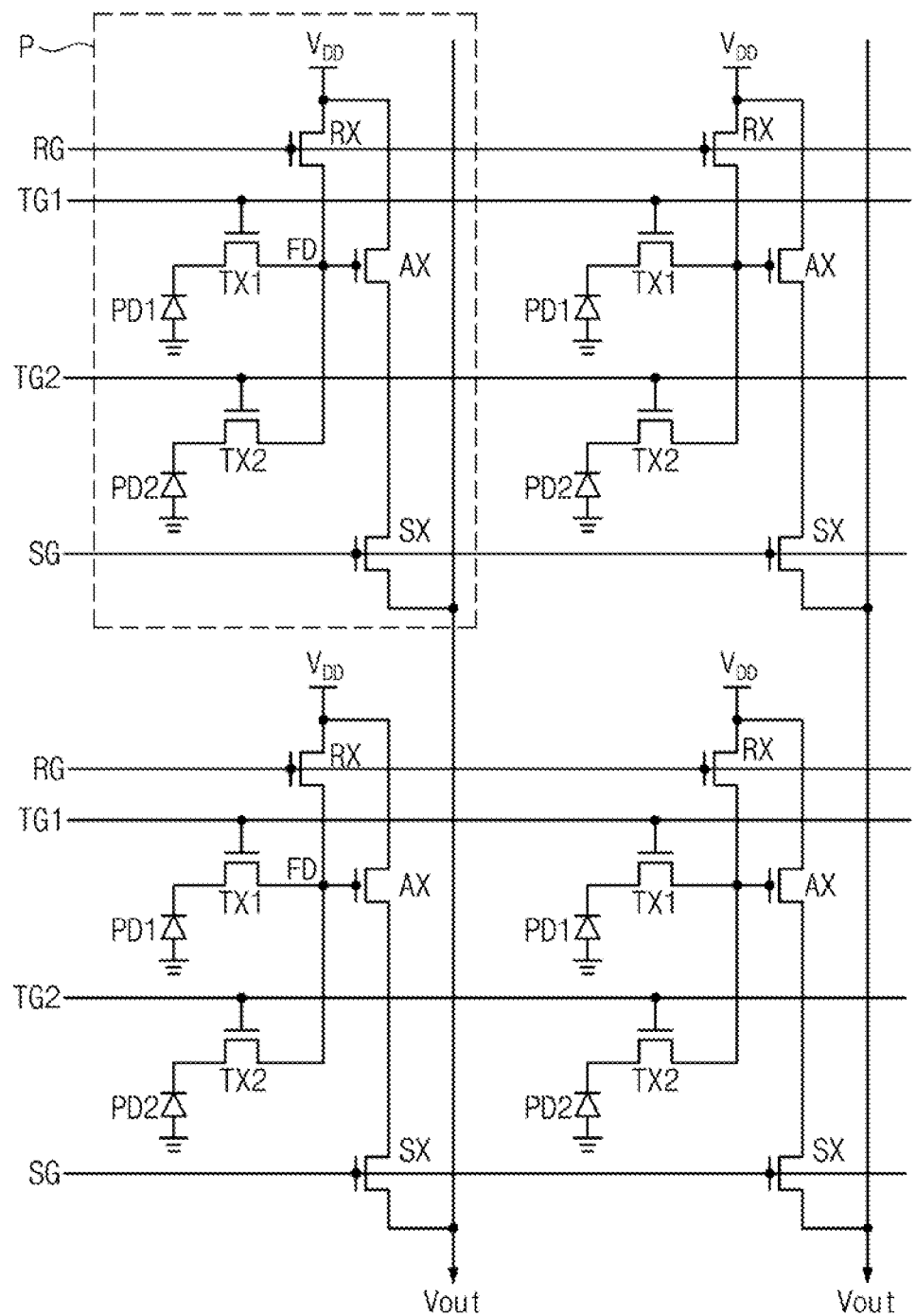
FIG. 3 illustrates a circuit diagram showing an active pixel sensor array of an image sensor according to embodiments.

FIG. 3 illustrates a circuit diagram showing an active pixel sensor array of an image sensor according to embodiments.

Referring to FIG. 3, the active pixel sensor array APS may include a plurality of unit pixels P, which unit pixels P may be arranged in a matrix shape along row and column directions. The unit pixel P may include first and second photoelectric conversion elements PD1 and PD2, transfer transistors TX1 and TX2, and logic transistors RX, SX and AX. The logic transistors RX, SX and AX may include a reset transistor RX, a selection transistor SX, and an amplifier transistor AX. Gate electrodes of first and second transfer transistors TX1 and TX2, of the reset transistor RX, and of the selection transistor SX may be correspondingly connected to drive signal lines TG1, TG2, RG, and SG.

The first transfer transistor TX1 may include a first transfer gate TG1 and a first photoelectric conversion element PD1, and the second transfer transistor TX2 may include a second transfer gate TG2 and a second photoelectric conversion element PD2. The first and second transfer transistors TX1 and TX2 may share a charge detection node FD or a floating diffusion region.

The first and second photoelectric conversion elements PD1 and PD2 may generate and accumulate photo-charges in proportion to an amount of externally incident light. The first and second photoelectric conversion elements PD1 and PD2 may be one of a photodiode, a photo-transistor, a photo-gate, a pinned photodiode (PPD), and any combination thereof.

The first and second transfer gates TG1 and TG2 may transfer charges accumulated in the first and second photoelectric conversion elements PD1 and PD2 to the charge detection node FD (or the floating diffusion region). The first and second transfer gates TG1 and TG2 may receive complementary signals. For example, the charges may be transferred to the charge detection node FD from one of the first and second photoelectric conversion elements PD1 and PD2.

The charge detection node FD may receive and accumulatively store the charges generated from the first and second photoelectric conversion elements PD1 and PD2. The amplifier transistor AX may be controlled by an amount of photo-charges accumulated in the charge detection node FD.

The reset transistor RX may periodically reset the charges accumulated in the charge detection node FD. For example, the reset transistor RX may have a drain electrode connected to the charge detection node FD and a source electrode connected to a power voltage $V_{DD}$. When the reset transistor RX is turned on, the charge detection node FD may receive the power voltage $V_{DD}$ connected to the source electrode of the reset transistor RX. Accordingly, when the reset transistor RX is turned on, the charges accumulated in the charge detection node FD may be exhausted and thus the charge detection node FD may be reset.

The amplifier transistor AX may amplify a variation in electrical potential at the charge detection node FD, and may output the amplified signal or a pixel signal through the selection transistor SX to an output line $V_{OUT}$. The amplifier transistor AX may be a source follower buffer amplifier that is configured to generate a source-drain current in proportion to an amount of photo-charges applied to a gate electrode. The amplifier transistor AX may have a gate electrode connected to the charge detection node FD, a drain electrode connected to the power voltage $V_{DD}$, and a source electrode connected to a drain electrode of the selection transistor SX.

The selection transistor SX may select each row of the unit pixel P to be readout. When the selection transistor SX is turned on, the power voltage $V_{DD}$ connected to the drain electrode of the amplifier transistor AX may be transmitted to the drain electrode of the selection transistor SX.

FIG. 4 illustrates a simplified plan view showing an image sensor according to embodiments.

Referring to FIG. 4, the image sensor 1111 may include an active pixel sensor (APS) array region R1 and a pad region R2.

The APS array region R1 may include a plurality of unit pixels P that are two-dimensionally arranged along a first direction D1 and a second direction D2. Each of the unit pixels P may include a photoelectric conversion element and readout elements. Each unit pixel P of the APS array region R1 may output electrical signals converted from incident light.

The APS array region R1 may include a central region CR and an edge region ER that surrounds the central region CR. For example, when viewed in plan, the edge region ER may be disposed on top, bottom, left, and right sides of the central region CR.

An incident angle of light incident on the edge region ER of the APS array region R1 may be different from that of light incident on the central region CR of the APS array region R1.

In addition, the edge region ER may include a light-shield region on which no or little light is incident. The light-shield region may include reference pixels on which no or little light is incident. An amount of charges sensed in the unit pixels P may be compared with a reference amount of charges occurring at reference pixels, which may result in obtaining magnitudes of electrical signals sensed in the unit pixels P.

The pad region R2 may include a plurality of conductive pads CP used for input and output of control signals and photoelectric conversion signals. For easy electrical connection with external devices, when viewed in plan, the pad region R2 may surround the APS array region R1. The conductive pads CP may allow an external device to receive electrical signals generated from the unit pixels P.

Figure 5A:
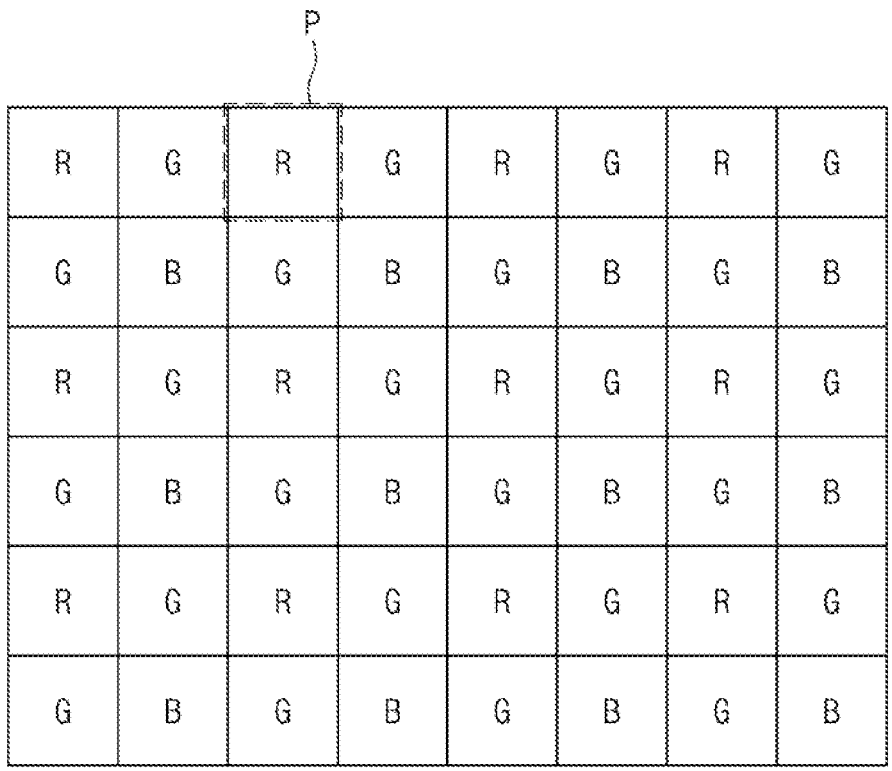
FIGS. 5A and 5B illustrate plan views showing a color filter array of an image sensor according to embodiments.
Figure 5B:
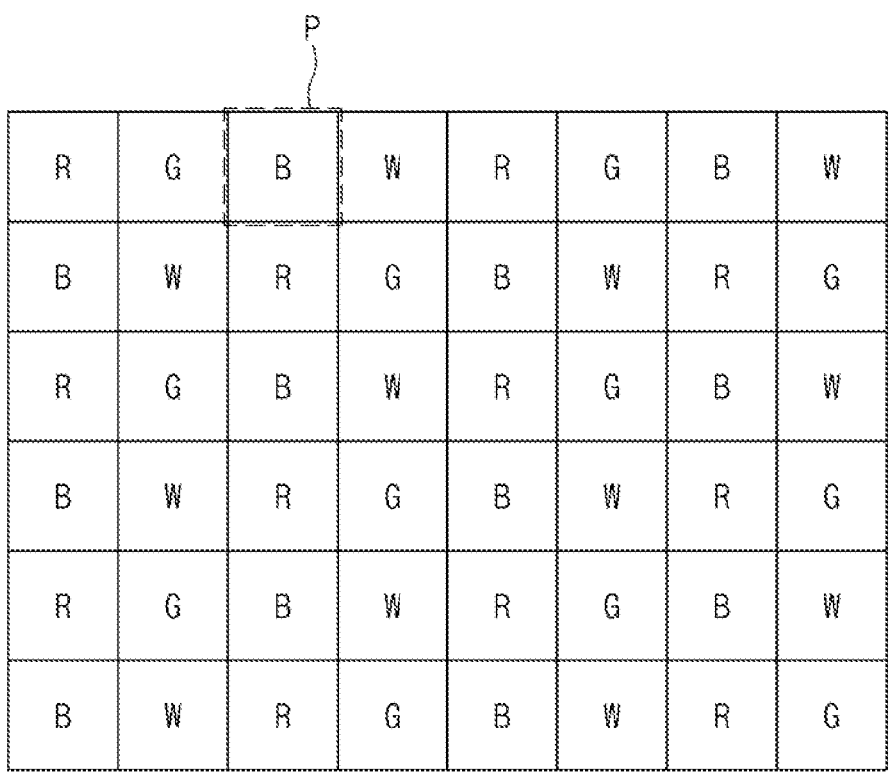

FIGS. 5A and 5B illustrate plan views showing a color filter array of an image sensor according to embodiments.

Referring to FIG. 5A, the active pixel sensor array APS may include a plurality of unit pixels P that are two-dimensionally arranged as discussed above, and color filters may be disposed to correspond to the unit pixels P.

Each of the unit pixels P may include one of a red color filter R, a green color filter G, and a blue color filter B. For example, the unit pixels P may include red pixels each including the red color filter R, blue pixels each including the blue color filter B, and green pixels each including the green color filter G. The red pixel may be configured such that the red color filter R may allow red visible light to pass therethrough, and that the photoelectric conversion element of the red pixel may generate photoelectrons that correspond to the red visible light. The blue pixel may be configured such that the blue color filter B may allow blue visible light to pass therethrough, and that the photoelectric conversion element of the blue pixel may generate photoelectrons that correspond to the blue visible light. The green pixel may be configured such that the green filter G may allow green visible light to pass therethrough, and that the photoelectric conversion element of the green pixel may generate photoelectrons that correspond to the green visible light.

Alternatively, the unit pixels P of the active pixel sensor array APS may include red, yellow, and blue color filters. Dissimilarly, the unit pixels P of the active pixel sensor array APS may include magenta, yellow, and cyan color filters.

For example, the color filters R, G, and B may be arranged in a Bayer pattern in which the number of the green color filters G is greater than twice the number of the red color filters R or the blue color filters B. In the Bayer pattern, the color filters R, G, and B disposed in the 2×2 arrangement may constitute a single color filter group, and the single color filter group may include two green color filters G that are disposed diagonally (e.g., cater-corner with each other) and also include a blue color filter B and a red color filter R that are disposed diagonally (e.g., cater-corner with each other). For example, each of the red and blue color filters R and B may be interposed between neighboring green color filters G. The Bayer-patterned color filter groups may be repeatedly arrayed along the first direction D1 and the second direction D2.

Referring to FIG. 5B, the active pixel sensor array APS may include color pixels and white pixels. Each of the color pixels may include one of red, green, and blue color filters R, G, and B. The white pixels may each include a white filter W that filters white color.

The red, green, and blue color filters R, G, and B and the white filter W may be arranged along one direction to constitute a single filter group, and a plurality of filter groups may be repeatedly arrayed along the first direction D1 and the second direction D2. For example, when viewed in the second direction D2, the white filter W may be interposed between the green color filters G. The color pixels and the white pixel may receive rays whose wavelength ranges are different from each other.

For another example, the active pixel sensor array APS may include depth pixels in place of the white pixels, and the depth pixels may each include an infrared filter that filters an infrared ray.

Figure 6A:
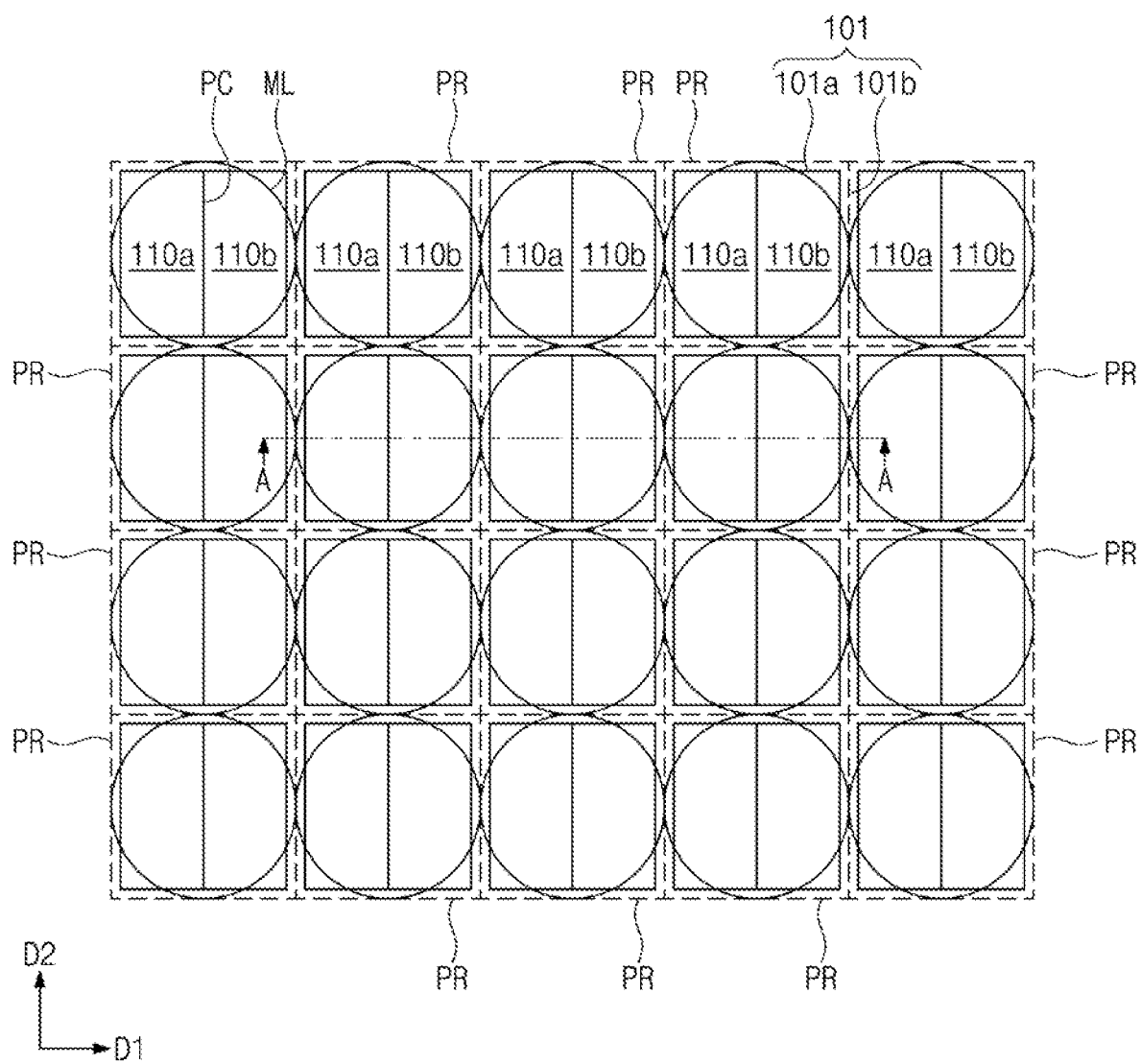
FIG. 6A illustrates a plan view partially showing an active pixel sensor array of an image sensor according to embodiments.
Figure 6B:
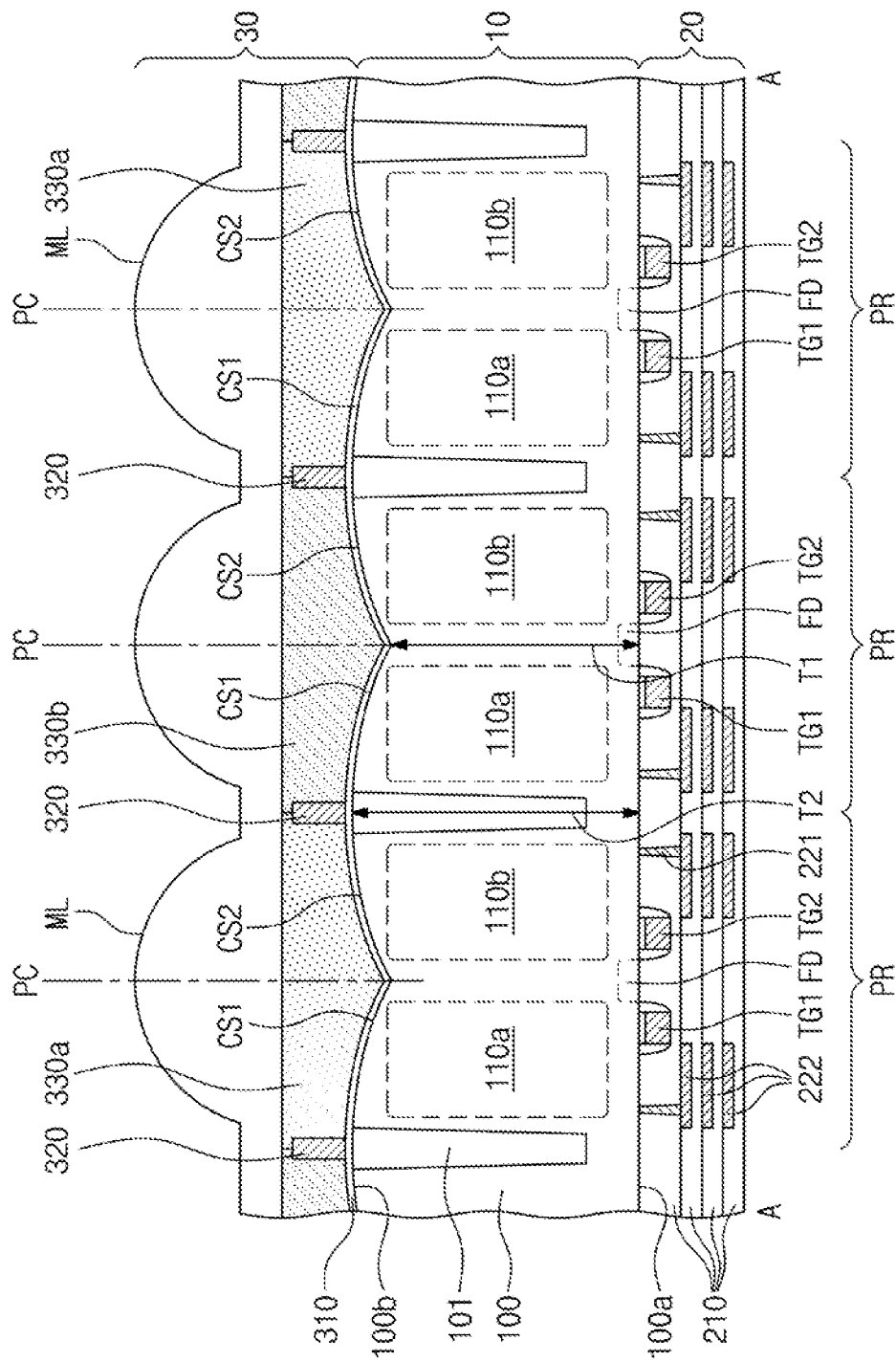
Figure 6D:
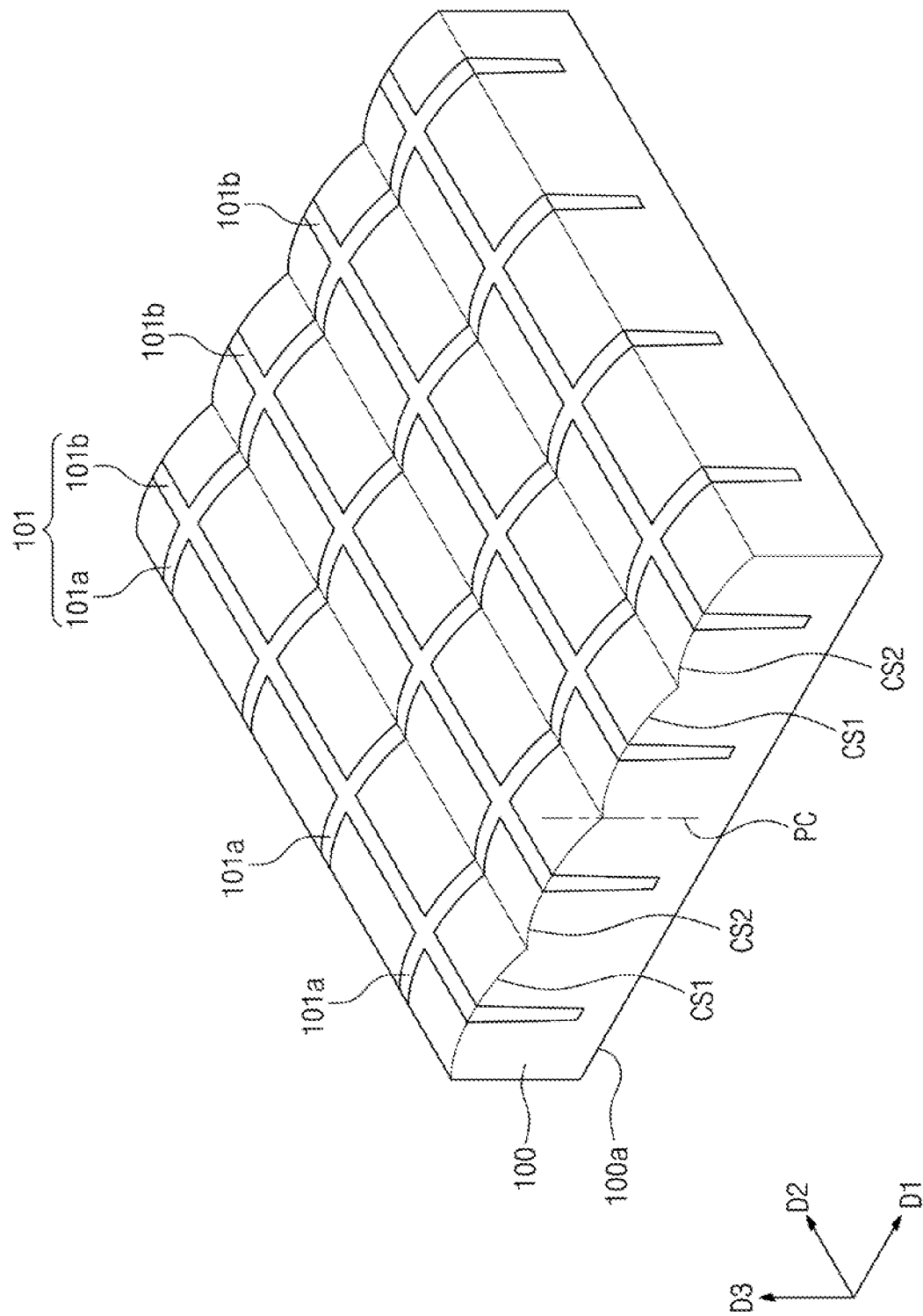
FIG. 6D illustrates a perspective view partially showing an image sensor according to embodiments.

FIG. 6A illustrates a plan view partially showing an active pixel sensor array of an image sensor according to embodiments. FIGS. 6B and 6C illustrate cross-sectional views taken along line A-A' of FIG. 6A, showing an image sensor according to embodiments. FIG. 6D illustrates a perspective view partially showing an image sensor according to embodiments.

Referring to FIGS. 6A and 6B, an image sensor according to embodiments may include a photoelectric conversion layer 10, a readout circuit layer 20, and an optical transmission layer 30. When viewed in cross-section, the photoelectric conversion layer 10 may be interposed between the readout circuit layer 20 and the optical transmission layer 30.

The photoelectric conversion layer 10 may include a semiconductor substrate 100, and also include first and second photoelectric conversion regions 110a and 110b that are provided in the semiconductor substrate 100. The semiconductor substrate 100 may have a front surface (or first surface) 100a and a rear surface (or second surface) 10b that face each other. The first and second photoelectric conversion regions 110a and 110b may be impurity sections each of which is doped with impurities having a second conductivity type (e.g., n-type) opposite to a first conductivity type of the semiconductor substrate 100. The first and second photoelectric conversion regions 110a and 110b may convert externally incident light into electrical signals.

For example, the semiconductor substrate 100 may be an epitaxial layer formed on a bulk silicon substrate having the same first conductivity type (e.g., p-type) as that of the epitaxial layer, or a p-type epitaxial layer from which a bulk silicon substrate is removed in a fabrication process of the image sensor. For another example, the semiconductor substrate 100 may be a bulk semiconductor substrate including a well of the first conductivity type.

The semiconductor substrate 100 may include a plurality of pixel regions PR defined by a pixel separation structure 101. The plurality of pixel regions PR may be arranged in a matrix shape along first and second directions D1 and D2 that intersect each other.

When viewed in plan, the pixel separation structure 101 may surround each of the pixel regions PR. For example, referring to FIG. 6D, the pixel separation structure 101 may include a plurality of first pixel isolation portions 101a that extend in parallel along the first direction D1 and are spaced apart from each other in the second direction D2, and also include a plurality of second pixel isolation portions 101b that extend in parallel along the second direction D2 while extending across the first pixel isolation portions 101a and are spaced apart from each other in the first direction D1. Each pixel region PR may be defined by a pair of first pixel isolation portions 101a and a pair of second pixel isolation portions 101b.

Each of the first and second pixel isolation portions 101a and 101b may have a substantially regular width. An interval between the first pixel isolation portions 101a may be substantially the same as an interval between the second pixel isolation portions 101b.

The pixel separation structure 101 may be formed of a dielectric material of which refractive index is less than that of the semiconductor substrate 100 (e.g., silicon), and may include a single or a plurality of dielectric layers. For example, the pixel separation structure 101 may include a silicon oxide layer, a silicon nitride layer, an undoped polysilicon layer, air, or a combination thereof. The pixel separation structure 101 may be formed by forming a deep trench by patterning the front surface 100a and/or the rear surface 100b of the semiconductor substrate 100, and then filling the deep trench with a dielectric material.

The pixel separation structure 101 may vertically extend from the rear surface 100b toward the front surface 100a of the semiconductor substrate 100, and may be spaced apart from the front surface 100a of the semiconductor substrate 100. Alternatively, the pixel separation structure 101 may penetrate the semiconductor substrate 100. In this case, the pixel separation structure 101 may have a vertical thickness substantially the same as that of the semiconductor substrate 100.

The pixel separation structure 101 may have a first width at a portion adjacent to the rear surface 100b of the semiconductor substrate 100 and a second width at a portion adjacent to the front surface 100a of the semiconductor substrate 100, which first width may be greater than the second width. The pixel separation structure 101 may have a width that gradually decreases as approaching the front surface 100a from the rear surface 100b of the semiconductor substrate 100.

The first and second photoelectric conversion regions 110a and 110b may be correspondingly provided on the pixel regions PR. The first and second photoelectric conversion regions 110a and 110b may be impurity sections each of which is doped with impurities having the second conductivity type (e.g., n-type) opposite to the first conductivity type of the semiconductor substrate 100. The semiconductor substrate 100 of the first conductivity type and the first and second photoelectric conversion regions 110a and 110b of the second conductivity type may constitute a pair of photodiodes. For example, a photodiode may be formed by junction between the semiconductor substrate 100 of the first conductivity type and one of the first and second photoelectric conversion regions 110a and 110b of the second conductivity type. The first and second photoelectric conversion regions 110a and 110b each constituting a photodiode may generate and accumulate photo-charges in proportion to intensity of incident light.

For example, as shown in FIG. 6C, a separation impurity region 103 may be interposed between the first and second photoelectric conversion regions 110a and 110b. The separation impurity region 103 may be formed by implanting the semiconductor substrate 100 with impurities having the same conductivity type (e.g., p-type) as that of the semiconductor substrate 100. The separation impurity region 103 may use a potential barrier to split incident light into two or more beams provided to the first and second photoelectric conversion regions 110a and 110b.

In each of the pixel regions PR, a phase difference may be provided between an electrical signal output from the first photoelectric conversion section 110a and an electrical signal output from the second photoelectric conversion section 110b. The image sensor may compare the phase difference between the electrical signals output from a pair of first and second photoelectric conversion regions 110a and 110b to thereby measure a distance from an object, to determine whether an object is in focus or not, and to decide how much out of focus, with the result that correction in focus may be automatically executed.

According to embodiments, the semiconductor substrate 100 may have convexly curved surfaces CS1 and CS2 on the rear surface 100b thereof. In each pixel region PR, neighboring convexly curved surfaces CS1 and CS2 may constitute a point of contact or a boundary between the first and second photoelectric conversion regions 110a and 110b. The pixel separation structure 101 may be disposed on a central line of each of the curved surfaces CS1 and CS2.

For example, on each of the pixel regions PR, the semiconductor substrate 100 may have a first curved surface CS1 and a second curved surface CS2. The first and second curved surfaces CS1 and CS2 may have substantially the same radius of curvature. The radius of curvature of the first and second curved surfaces CS1 and CS2 may be determined by a refractive index n1 of the semiconductor substrate 100 and a refractive index n2 of a surface dielectric layer 310 that covers the first and second curved surfaces CS1 and CS2. The first curved surface CS1 and the second curved surface CS2 may meet at a pixel center PC. The pixel center PC may indicate a location at the same distance from each of a pair of first pixel isolation portions 101a. The first curved surface CS1 and the second curved surface CS2 may be symmetrical to each other about the pixel center PC. The first curved surface CS1 and the second curved surface CS2 may extend along the second direction D2 as shown in FIG. 6D.

The semiconductor substrate 100 may have a first thickness T1 or a minimum thickness at the pixel center PC, and also have a second thickness T2 or a maximum thickness at a boundary (see PB of FIG. 7A) between the pixel regions PR. In addition, the semiconductor substrate 100 may have a thickness that increases along the first direction D1 as approaching a boundary (see PB of FIG. 7A) between the pixel regions PR from the pixel center PC.

According to embodiments, on each pixel region PR, the first photoelectric conversion section 110a may be provided below the first curved surface CS1, and the second photoelectric conversion section 110b may be provided below the second curved surface CS2. When each pixel region PR receives incident light, the first and second curved surfaces CS1 and CS2 may split the incident light into two or more beams provided to the first and second photoelectric conversion regions 110a and 110b.

The first and second curved surfaces CS1 and CS2 may be formed by forming mask patterns that have convex curved surfaces on the flat rear surface 100b of the semiconductor substrate 100, and then performing an etch-back process. The mask patterns may be formed by forming a mask layer on the flat rear surface 100b of the semiconductor substrate 100, and then performing patterning and reflow processes on the mask layer.

In embodiments, the readout circuit layer 20 may be disposed on the front surface 100a of the semiconductor substrate 100. The readout circuit layer 20 may include readout circuits (e.g., metal oxide semiconductor (MOS) transistors) connected to the photoelectric conversion layer 10. The readout circuit layer 20 may signally process the electrical signals converted in the photoelectric conversion layer 10.

For example, on each of the pixel regions PR, a floating diffusion region FD may be interposed between the first and second photoelectric conversion regions 110a and 110b. In each of the pixel regions PR, the floating diffusion region FD may be formed by implanting the front surface 100a of the semiconductor substrate 100 with impurities having the second conductivity type.

On the front surface 100a of the semiconductor substrate 100, a first transfer gate electrode TG1 may be interposed between the first photoelectric conversion section 110a and the floating diffusion region FD, and a second transfer gate electrode TG2 may be interposed between the second photoelectric conversion section 110b and the floating diffusion region FD.

Interlayer dielectric layers 210 may be stacked on the front surface 100a of the semiconductor substrate 100, and the interlayer dielectric layers 210 may cover the MOS transistors and the first and second transfer gate electrodes TG1 and TG2 that constitute the readout circuits. The interlayer dielectric layers 210 may include, for example, one or more of silicon oxide, silicon nitride, and silicon oxynitride.

The interlayer dielectric layers 210 may have therein wiring structures 221 and 222 connected to the readout circuits. The wiring structures 221 and 222 may include metal lines 222 and contact plugs 221 that connect the metal lines 222 to each other.

The optical transmission layer 30 may be disposed on the rear surface 100b of the semiconductor substrate 100. The optical transmission layer 30 may include a surface dielectric layer 310, a color filter array, a grid structure 320, and a micro-lens array.

The surface dielectric layer 310 may have a regular thickness that covers the first and second curved surfaces CS1 and CS2 of the semiconductor substrate 100. For example, the surface dielectric layer 310 may have curved top and bottom surfaces. For another example, the surface dielectric layer 310 may have a flat top surface. The surface dielectric layer 310 may include silicon oxide, aluminum oxide, or hafnium oxide. The surface dielectric layer 310 may be a single layer and a multiple layer.

The color filter array may be interposed between the surface dielectric layer 310 and the micro-lens array. As discussed with reference to FIG. 5A, the color filter array may include red, green, and blue color filters 330a and 330b. Alternatively, the color filter array may include cyan, magenta, and yellow color filters. Dissimilarly, the color filter array may include white filters discussed with reference to FIG. 5B. The color filters 330a and 330b may fill spaces between the micro-lens array and the first and second curved surfaces CS1 and CS2 of the semiconductor substrate 100, and may have their substantially flat top surfaces.

The grid structure 320 may be interposed between the color filters 330a and 330b. Similar to the pixel separation structure 101, the grid structure 320 may have a grid shape when viewed in plan.

The grid structure 320 may include one or more of a light-shield pattern and a low-refractive pattern. The light-shield pattern may include a metallic material, such as titanium, tantalum, or tungsten. The low-refractive pattern may be formed of a material whose refractive index is less than that of the light-shield pattern. The low-refractive pattern may be formed of an organic material and may have a refractive index of about 1.1 to about 1.3. For example, the grid structure 320 may be a polymer layer including silica nano-particles.

The micro-lens array may include a plurality of micro-lenses ML that concentrate externally incident light. When viewed in plan, the micro-lenses ML may be two-dimensionally arranged along the first and second directions D1 and D2 that intersect each other. The micro-lenses ML may be provided on corresponding pixel regions PR. The micro-lenses ML may have their convex shapes that concentrate incident light.

Figure 7A:
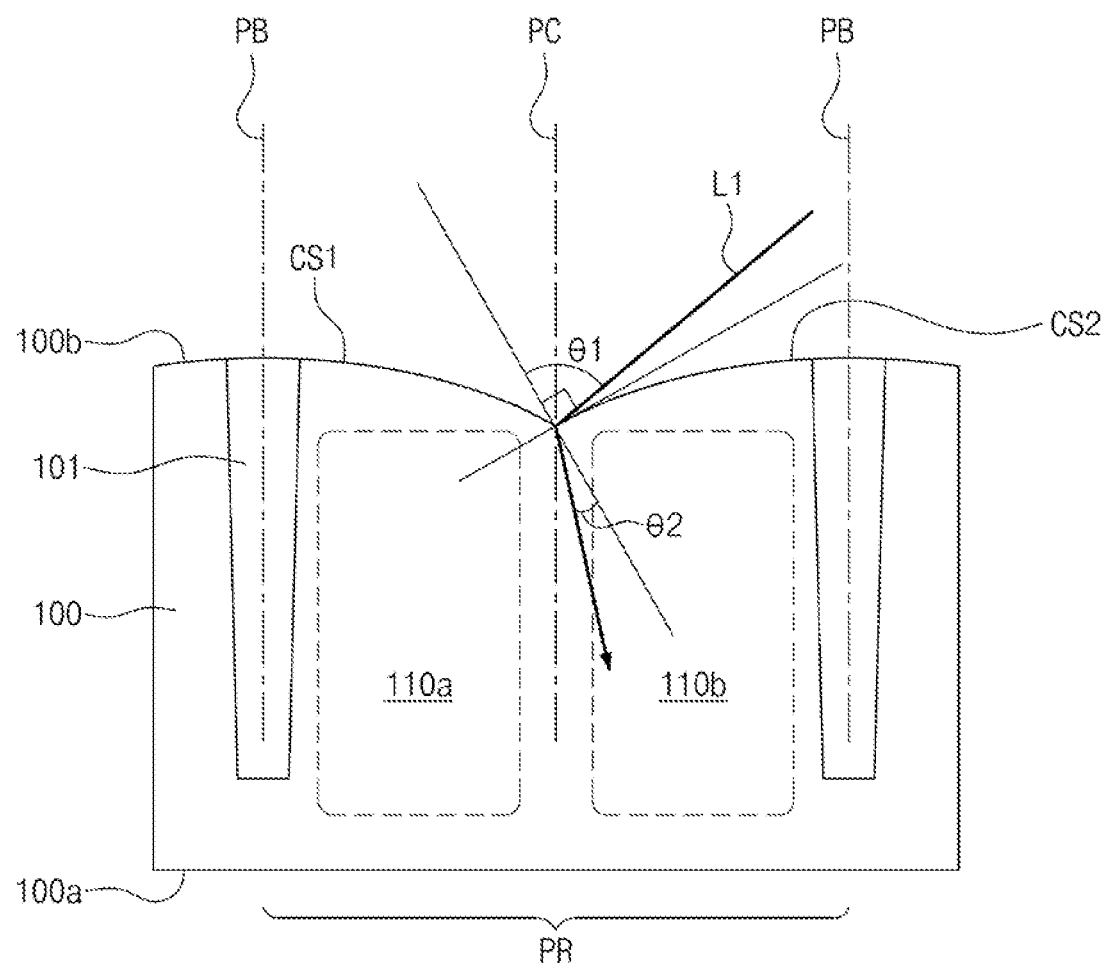
FIGS. 7A and 7B illustrate cross-sectional views showing optical separation between photodiodes in a unit pixel of an image sensor according to embodiments.
Figure 7B:
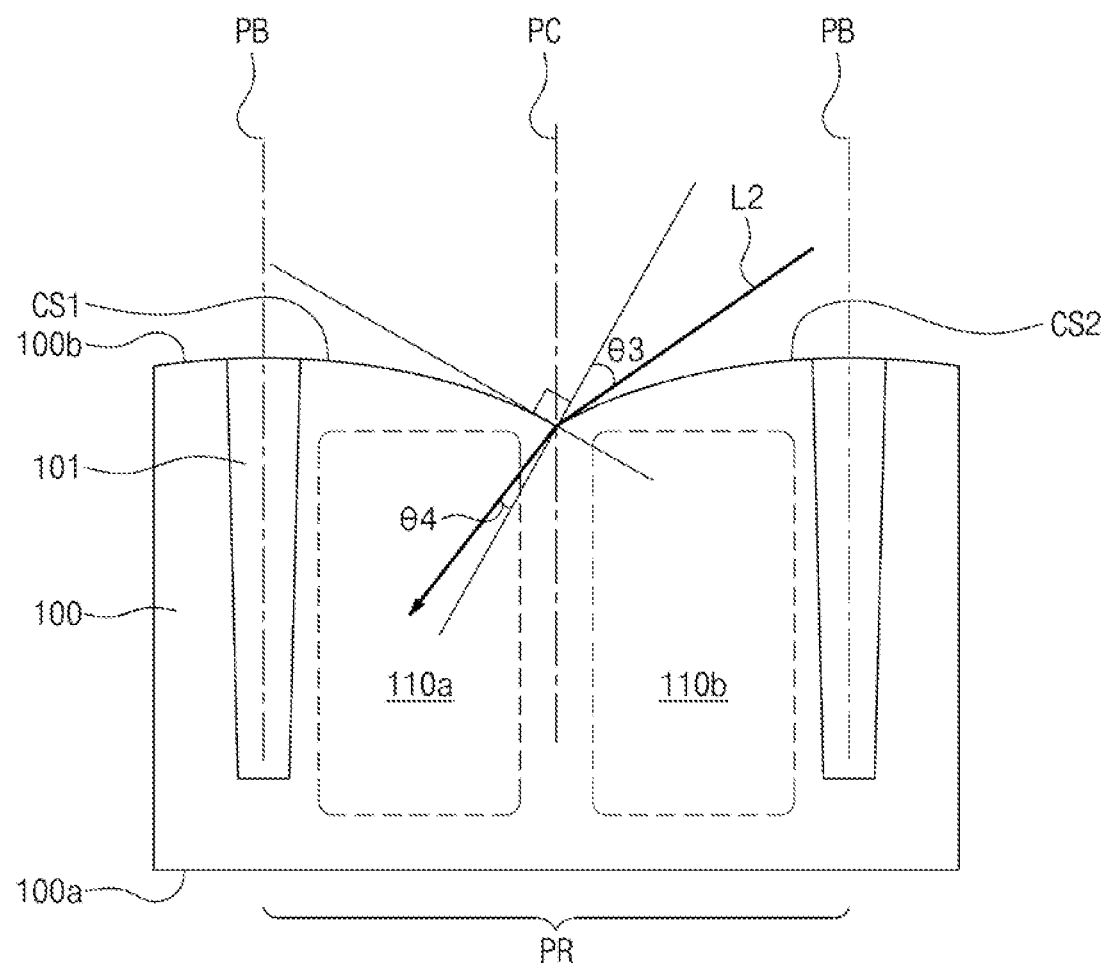

FIGS. 7A and 7B illustrate cross-sectional views showing optical separation between photodiodes in a unit pixel of an image sensor according to embodiments.

Referring to FIGS. 7A and 7B, on each pixel region PR, the semiconductor substrate 100 may have the first and second curved surfaces CS1 and CS2 that are symmetrical to each other. The first and second curved surfaces CS1 and CS2 may have substantially the same radius of curvature, and may have therebetween a point of contact or a boundary that vertically overlaps the pixel center PC. The first and second curved surfaces CS1 and CS2 may refract light incident on the pixel region PR, and the refracted light may travel toward the first photoelectric conversion section 110a or the second photoelectric conversion section 110b.

When an angle is provided between a boundary PC between the first and second curved surfaces CS1 and CS2 and a line perpendicular to a line that passes through a curve center of each of the first and second curved surfaces CS1 and CS2, and when the angle is set to be larger than an angle (e.g., about 22.2°), the first photoelectric conversion section 110a may receive light incident at all angles on the first curved surface CS1, and the second photoelectric conversion section 110b may receive light incident at all directions on the second curved surface CS2.

When the surface dielectric layer 310 has a refractive index greater than that of an oxide layer, although a refracting angle of silicon may become smaller at the first and second curved surfaces CS1 and CS2, the refracting angle may become larger at an interface between the surface dielectric layer 310 and the color filters 330a and 330b, and an incident angle may become smaller at the first and second curved surfaces CS1 and CS2. As a result, light incident at an angle greater than that of a normal line to the first curved surface CS1 (or the second curved surface CS2) may travel toward the first photoelectric conversion section 110a (or the second photoelectric conversion section 110b) below the first curved surface CS1 (or the second curved surface CS2).

As shown in FIG. 7A, when light L1 is incident at a first angle $\theta 1$, the light may be refracted at a second angle $\theta 2$ relative to a normal line to the second curved surface CS2 and thus may travel toward the second photoelectric conversion section 110b. As shown in FIG. 7B, when light L2 is incident at a third angle $\theta 3$, the light may be refracted at a fourth angle $\theta 4$ relative to a normal line to the first curved surface CS1 and thus may travel toward the first photoelectric conversion section 110a.

In the embodiments that follow, the components the same as those of the embodiments discussed above will be allocated the same reference numerals thereto, and differences thereof will be described in detail.

Figure 8A:
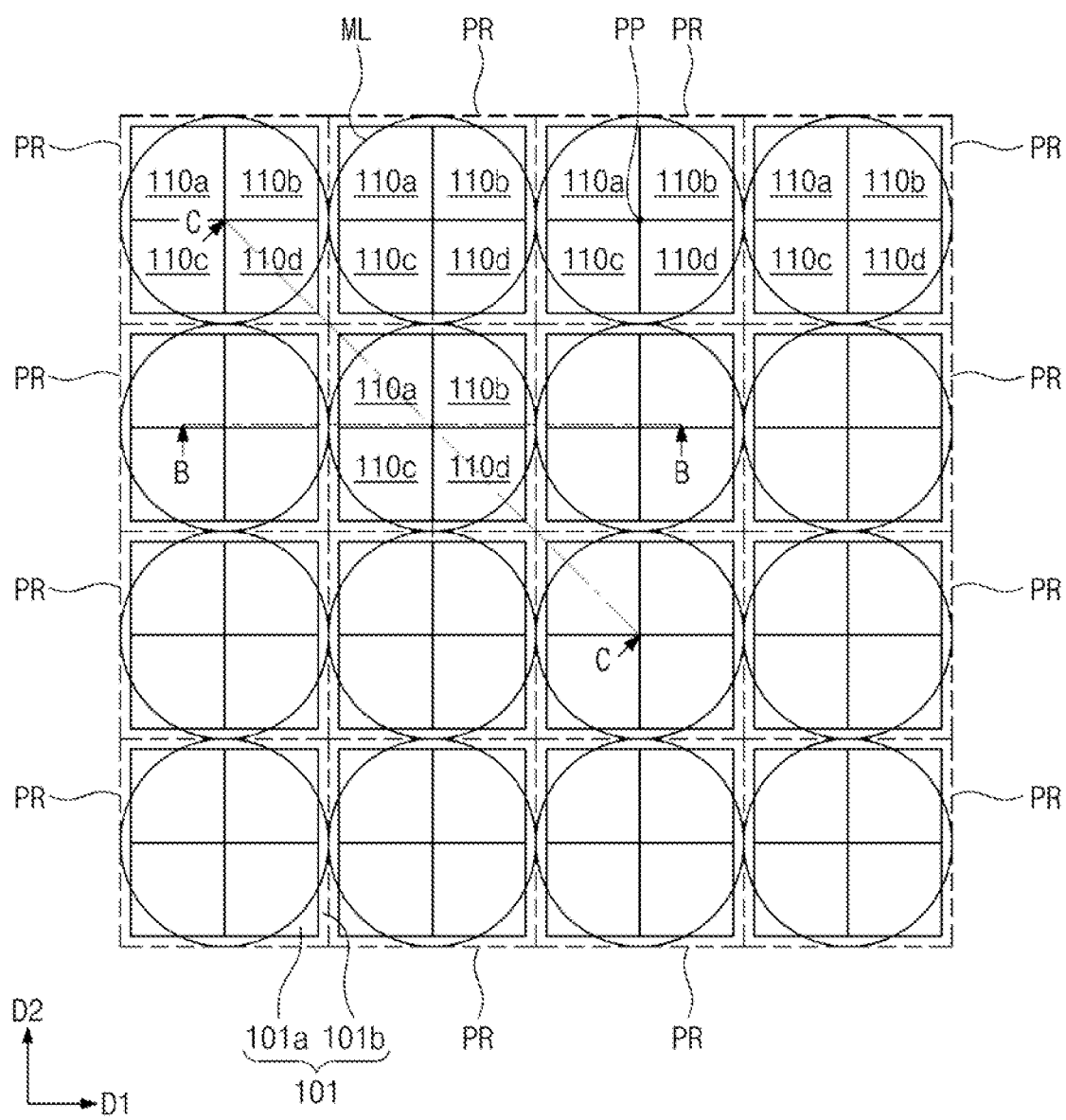
FIG. 8A illustrates a plan view partially showing an active pixel sensor array of an image sensor according to embodiments.
Figure 8B:
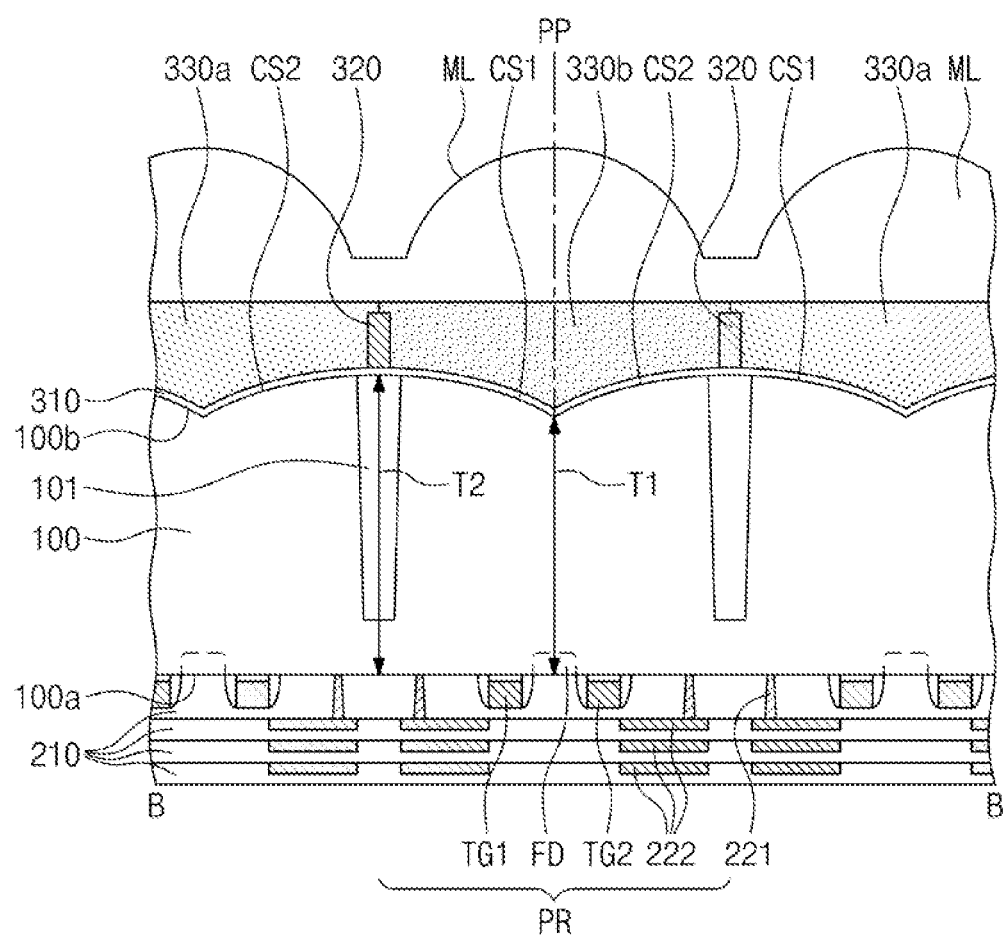
FIGS. 8B and 8C illustrate cross-sectional views respectively taken along lines B-B' and C-C' of FIG. 8A, showing an image sensor according to embodiments.
Figure 8C:
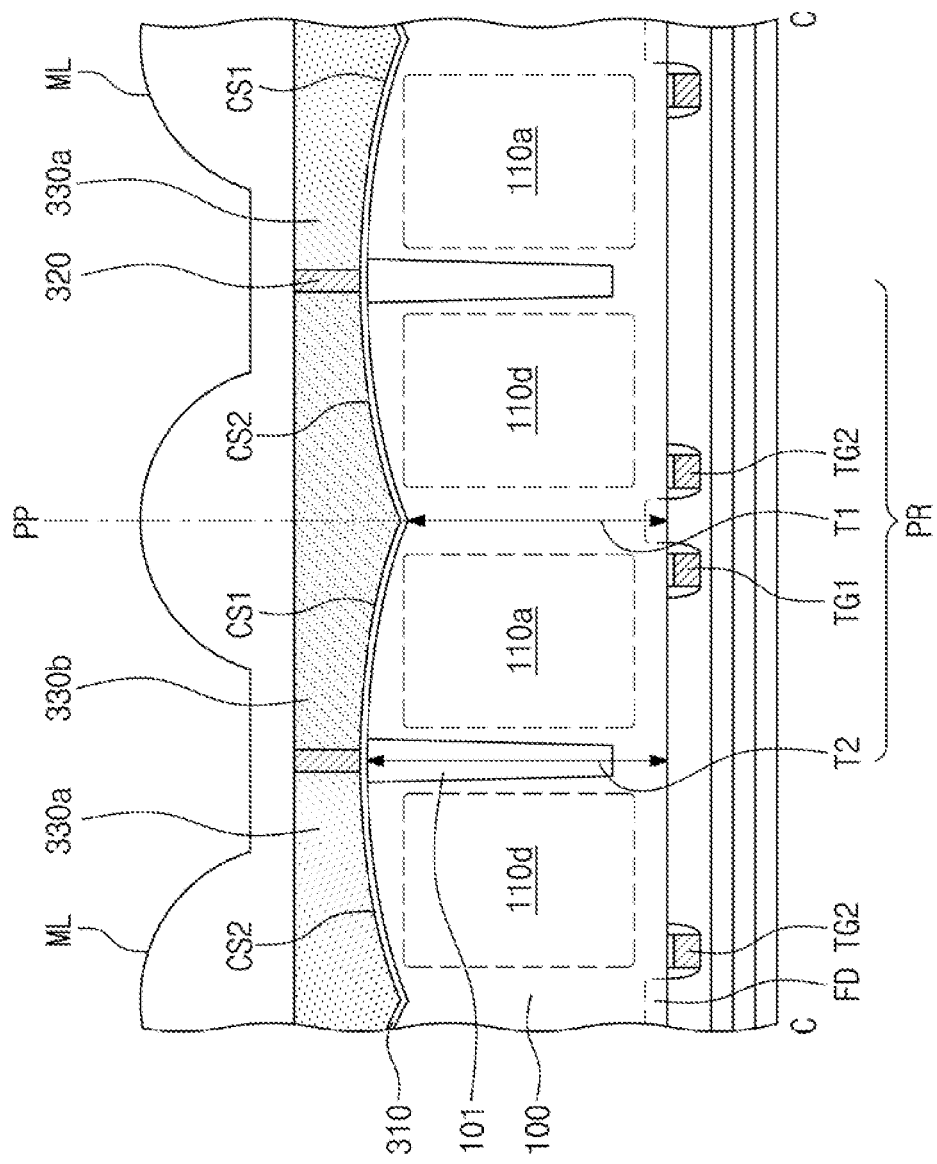

FIG. 8A illustrates a plan view partially showing an active pixel sensor array of an image sensor according to embodiments. FIGS. 8B and 8C illustrate cross-sectional views respectively taken along lines B-B' and C-C' of FIG. 8A, showing an image sensor according to embodiments.

Referring to FIGS. 8A, 8B, and 8C, first, second, third, and fourth photoelectric conversion regions 110a, 110b, 110c, and 110d may be provided on corresponding pixel regions PR. The first, second, third, and fourth photoelectric conversion regions 110a, 110b, 110c, and 110d may be impurity sections each of which is doped with impurities having a second conductivity type (e.g., n-type) opposite to a first conductivity type of the semiconductor substrate 100. In each of the pixel regions PR, the first, second, third, and fourth photoelectric conversion regions 110a, 110b, 110c, and 110d may be spaced apart from each other in the first direction D1 and the second direction D2.

In each pixel region PR, the semiconductor substrate 100 may have the first and second curved surfaces CS1 and CS2 in all directions, and the first and second curved surfaces CS1 and CS2 may meet at a pixel central point PP. The pixel central point PP may be positioned at the same distance from the first pixel isolation portions 101a and the second pixel isolation portions 101b.

The semiconductor substrate 100 may have a first thickness T1 or a minimum thickness at the pixel central point PP, and also have a second thickness T2 or a maximum thickness at a boundary between the pixel regions PR in the first and second directions D1 and D2. For example, the first and second pixel isolation portions 101a and 101b may have the second thickness T2 or the maximum thickness. In addition, the semiconductor substrate 100 may have a thickness that increases in all directions as approaching the boundary between the pixel regions PR from the pixel central point PP.

Figure 9A:
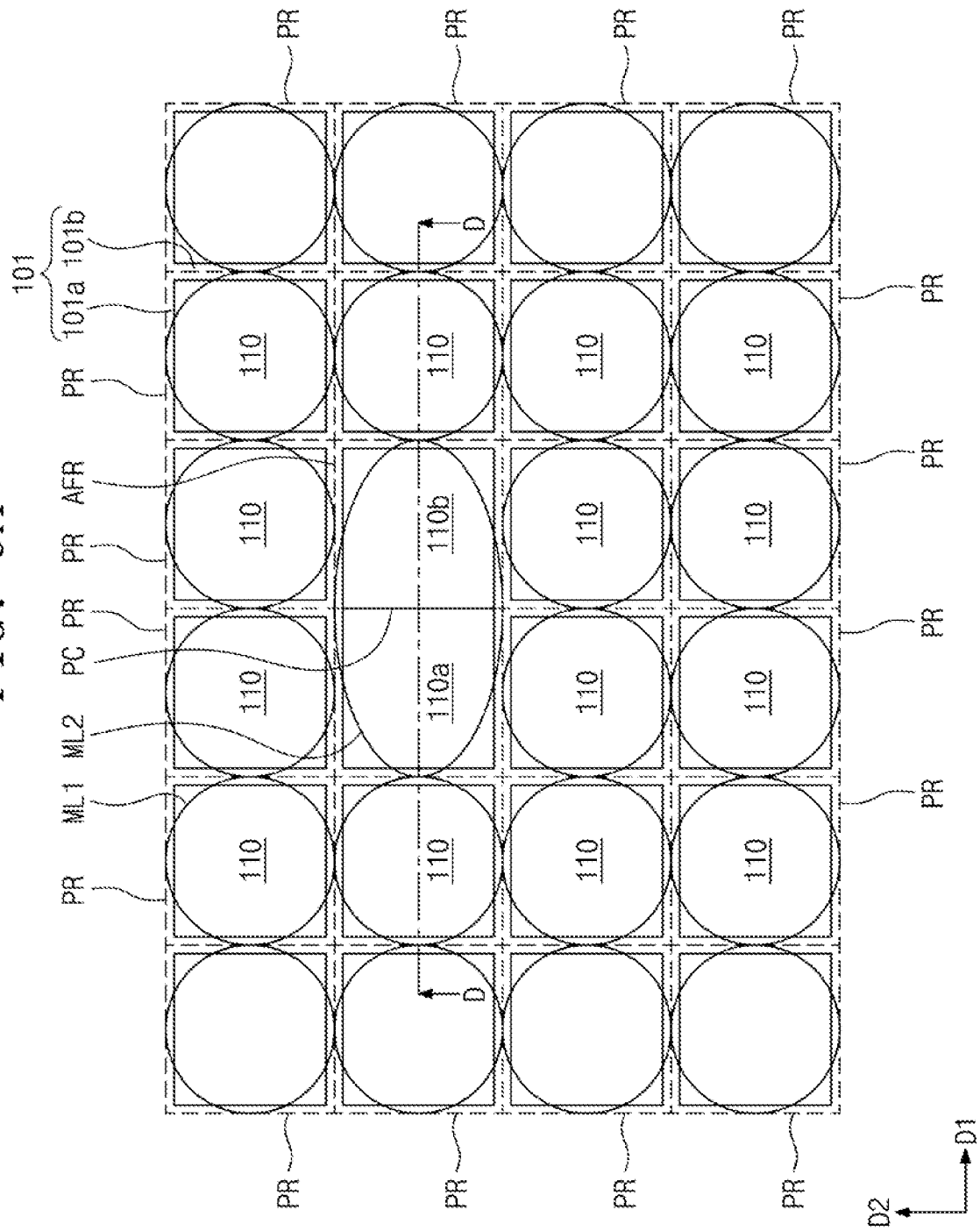
FIG. 9A illustrates a plan view partially showing an active pixel sensor array of an image sensor according to embodiments.
Figure 9B:
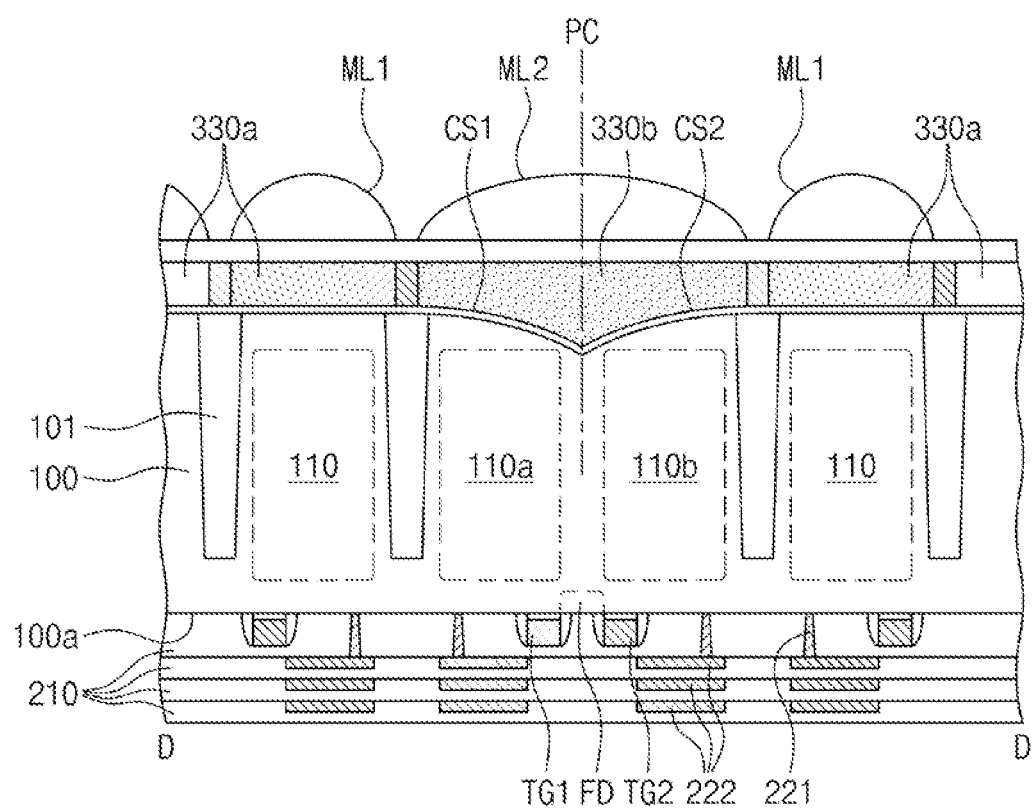
FIG. 9B illustrates a cross-sectional view taken along line D-D' of FIG. 9A, showing an image sensor according to embodiments.

FIG. 9A illustrates a plan view partially showing an active pixel sensor array of an image sensor according to embodiments. FIG. 9B illustrates a cross-sectional view taken along line D-D' of FIG. 9A, showing an image sensor according to embodiments.

Referring to FIGS. 9A and 9B, the semiconductor substrate 100 may include at least one autofocus pixel region AFR and a plurality of pixel regions PR defined by the pixel separation structure 101.

As discussed above, the pixel separation structure 101 may include a plurality of first pixel isolation portions 101a that extend in parallel along the first direction D1 and are spaced apart from each other in the second direction D2, and also include a plurality of second pixel isolation portions 101b that extend in parallel along the second direction D2 while extending across the first pixel isolation portions 101a and are spaced apart from each other in the first direction D1. The pixel separation structure 101 may not be provided in the autofocus pixel region AFR.

The plurality of pixel regions PR may be two-dimensionally arranged along the first direction D1 and the second direction D2, and when viewed in plan, may surround the autofocus pixel region AFR.

The semiconductor substrate 100 may have the first and second curved surfaces CS1 and CS2 that are mirror-symmetrical to each other on the autofocus pixel region AFR. The first curved surface CS1 and the second curved surface CS2 may meet at a center PC of the autofocus pixel region AFR. In each pixel region PR, the semiconductor substrate 100 may have a substantially flat rear surface 100b.

Photoelectric conversion regions 110 may be provided on corresponding pixel regions PR. The first and second photoelectric conversion regions 110a and 110b may be provided on the autofocus pixel region AFR. For example, one photoelectric conversion section 110 may be provided on each of the pixel regions PR, and a pair of first and second photoelectric conversion regions 110a and 110b may be provided on the autofocus pixel region AFR. As discussed above, the first photoelectric conversion section 110a may be provided below the first curved surface CS1, and the second photoelectric conversion section 110b may be provided below the second curved surface CS2. The autofocus pixel region AFR may include a separation impurity region 103 between the first and second photoelectric conversion regions 110a and 110b, as discussed above with reference to FIG. 6C.

Each of the first and second photoelectric conversion regions 110a and 110b may have an area substantially the same as that of the photoelectric conversion section 110. For example, the autofocus pixel region AFR may have an area that is about twice an area of each pixel region PR.

First micro-lenses ML1 may be provided on corresponding pixel regions PR, and a second micro-lens ML2 may be provided on the autofocus pixel region AFR.

The first micro-lens ML1 may have substantially the same radius in the first and second directions D1 and D2, and the second micro-lens ML2 may have different radii in the first and second directions D1 and D2. When viewed in plan, the first micro-lens ML1 may have a substantially circular shape, and the second micro-lens ML2 may have an oval shape.

Figure 10A:
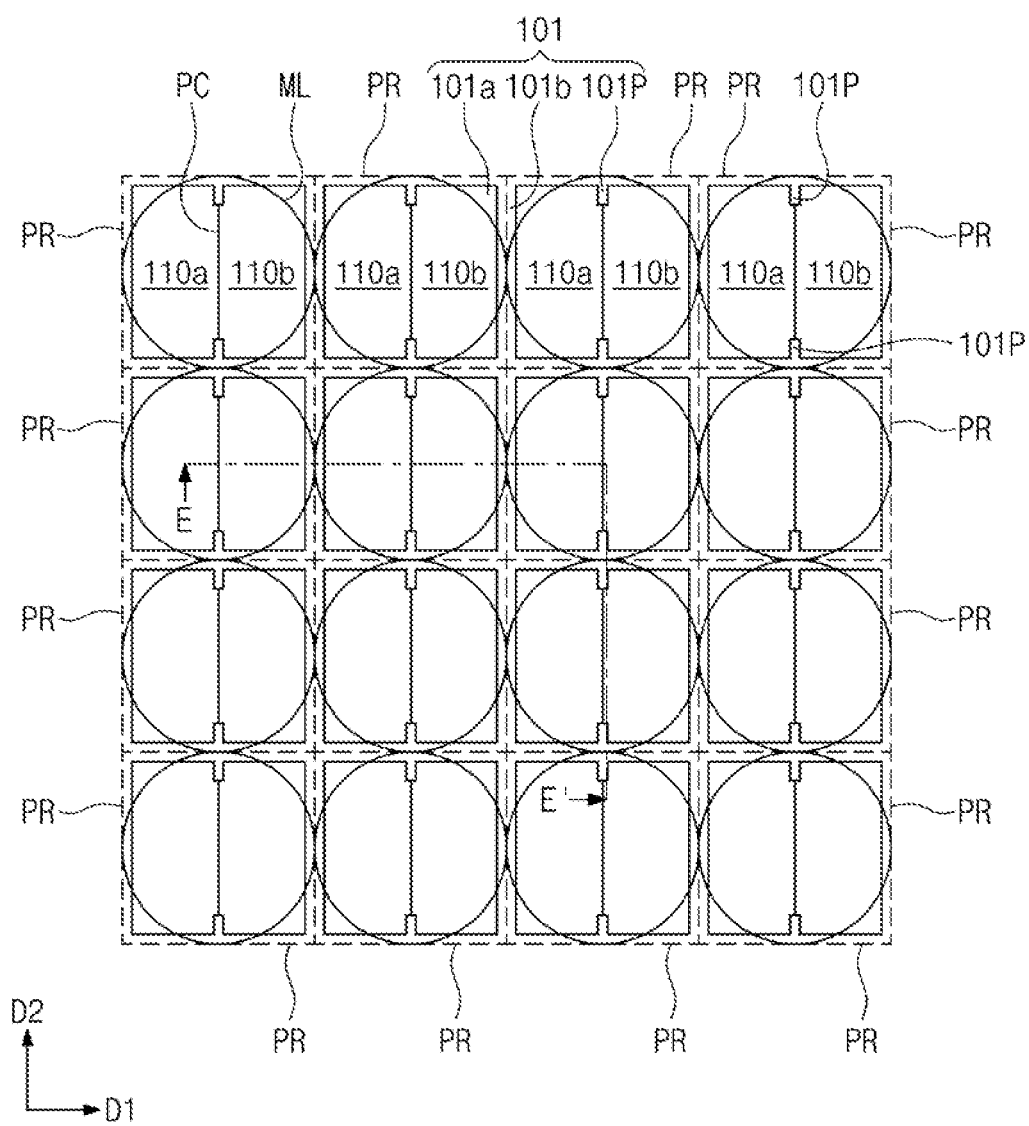
FIG. 10A illustrates a plan view partially showing an active pixel sensor array of an image sensor according to embodiments.
Figure 10B:
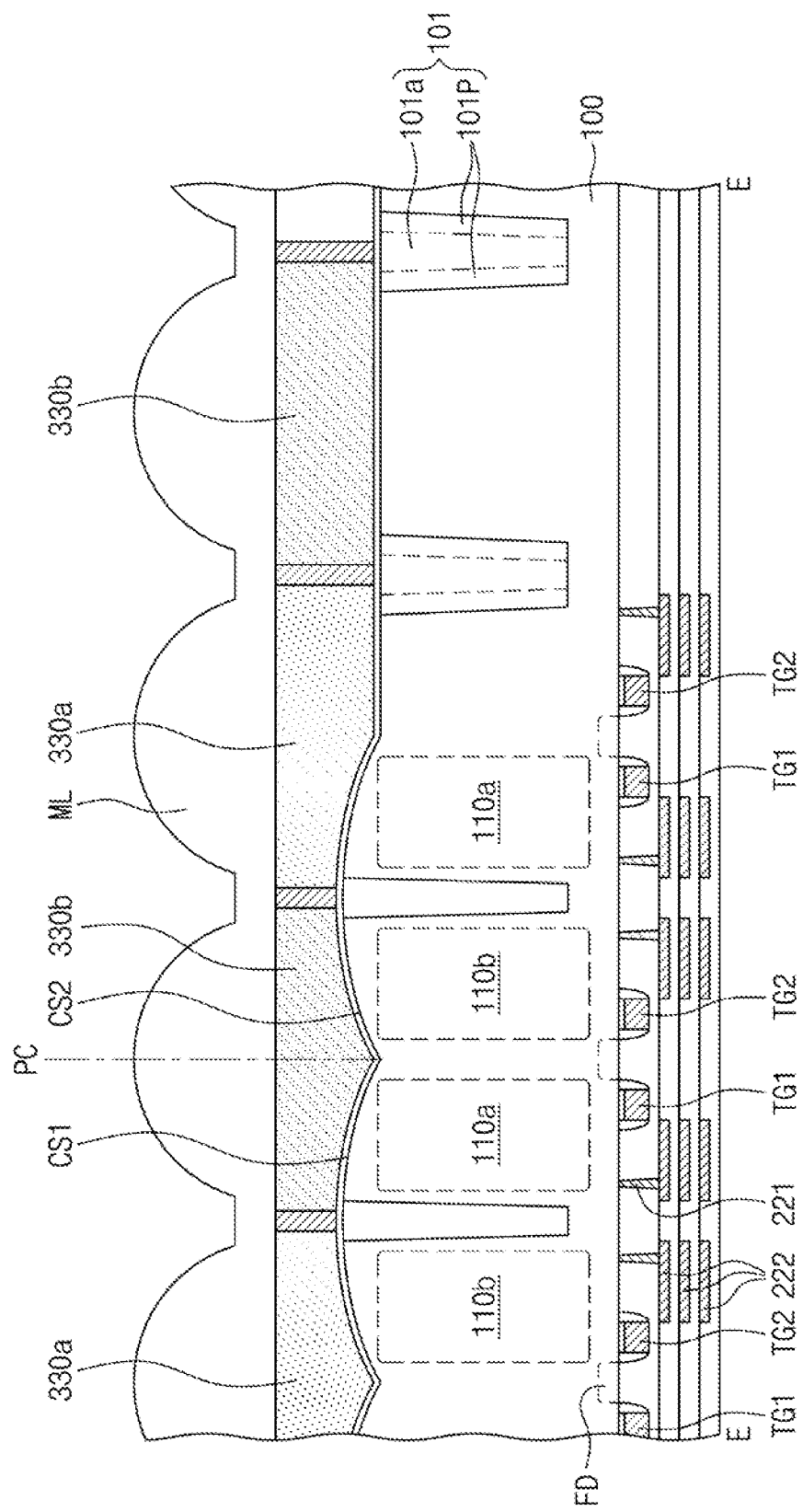
FIG. 10B illustrates a cross-sectional view taken along line E-E' of FIG. 10A, showing an image sensor according to embodiments.

FIG. 10A illustrates a plan view partially showing an active pixel sensor array of an image sensor according to embodiments. FIG. 10B illustrates a cross-sectional view taken along line E-E' of FIG. 10A, showing an image sensor according to embodiments.

Referring to FIGS. 10A and 10B, the semiconductor substrate 100 may have the first and second curved surfaces CS1 and CS2 that are mirror-symmetrical to each other on each pixel region PR. The first and second photoelectric conversion regions 110a and 110b may be provided on each pixel region PR.

The pixel separation structure 101 may include a plurality of first pixel isolation portions 101a that extend in the first direction D1, a plurality of second pixel isolation portions 101b that extend in the second direction D2, and a plurality of protrusions 101P that protrude in the second direction D2 from the first pixel isolation portions 101a. The protrusions 101P may protrude in the second direction D2 toward a center of each pixel region PR. The protrusions 101P of the pixel separation structure 101 may be interposed between the first and second photoelectric conversion regions 110a and 110b on each of the pixel regions PR, and may protrude in the second direction D2.

The protrusions 101P of the pixel separation structure 101 may physically reflect incident light on an edge of the pixel region PR and may separate a section that is hard to form an electrical potential barrier, and therefore may reduce crosstalk issues between the first and second photoelectric conversion regions 110a and 110b at an edge of the pixel region PR.

Figure 11A:
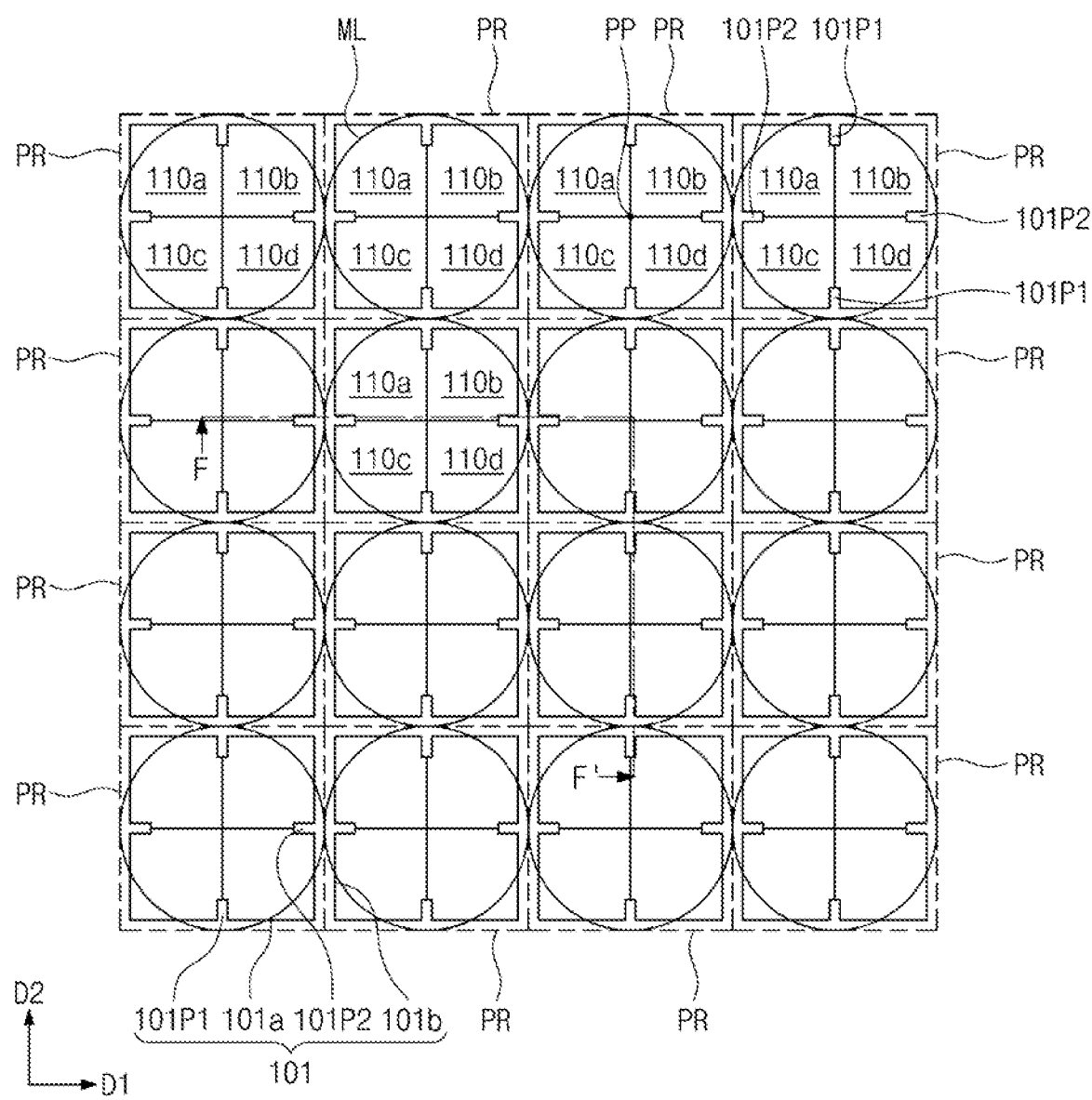
FIG. 11A illustrates a plan view partially showing an active pixel sensor array of an image sensor according to embodiments.
Figure 11B:
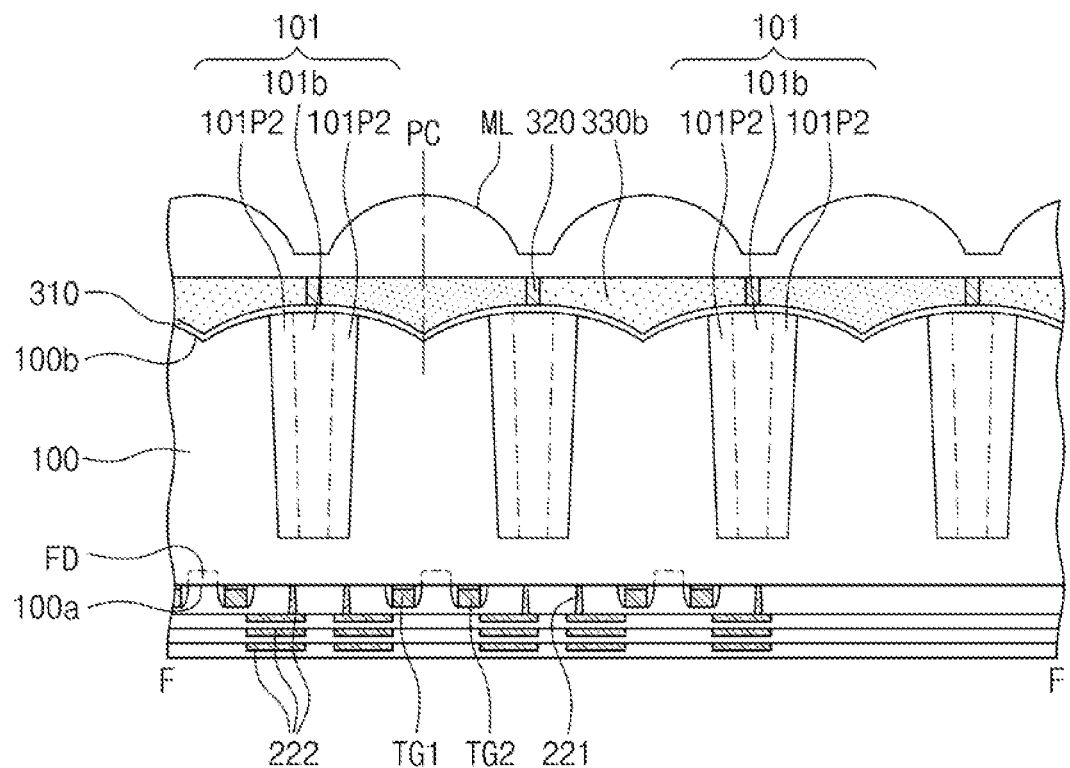
FIG. 11B illustrates a cross-sectional view taken along line F-F' of FIG. 11A, showing an image sensor according to embodiments.

FIG. 11A illustrates a plan view partially showing an active pixel sensor array of an image sensor according to embodiments. FIG. 11B illustrates a cross-sectional view taken along line F-F' of FIG. 11A, showing an image sensor according to embodiments.

Referring to FIGS. 11A and 11B, first, second, third, and fourth photoelectric conversion regions 110a, 110b, 110c, and 110d may be provided on each pixel region PR.

As discussed with reference to FIGS. 8A and 8B, on each pixel region PR, the semiconductor substrate 100 may have first and second curved surfaces CS1 and CS2 in all directions, and the first and second curved surfaces CS1 and CS2 may meet at a pixel central point PP. The semiconductor substrate 100 may have a first thickness T1 or a minimum thickness at the pixel central point PP, and also have a second thickness T2 or a maximum thickness at a boundary between the pixel regions PR in the first and second directions D1 and D2.

The pixel separation structure 101 may include a plurality of first pixel isolation portions 101a that extend in the first direction D1, a plurality of second pixel isolation portions 101b that extend in the second direction D2, a plurality of first protrusions 101P1 that protrude in the second direction D2 from the first pixel isolation portions 101a, and a plurality of second protrusions 101P2 that protrude in the first direction D1 from the second pixel isolation portions 101b. The first and second protrusions 101P1 and 101P2 may locally protrude toward the pixel central point PP of each of the pixel regions PR.

The first protrusions 101P1 of the pixel separation structure 101 may be interposed between the first and second photoelectric conversion regions 110a and 110b and between the third and fourth photoelectric conversion regions 110c and 110d. The second protrusions 101P2 of the pixel separation structure 101 may be interposed between the first and third photoelectric conversion regions 110a and 110c and between the second and fourth photoelectric conversion regions 110b and 110d.

Figure 12A:
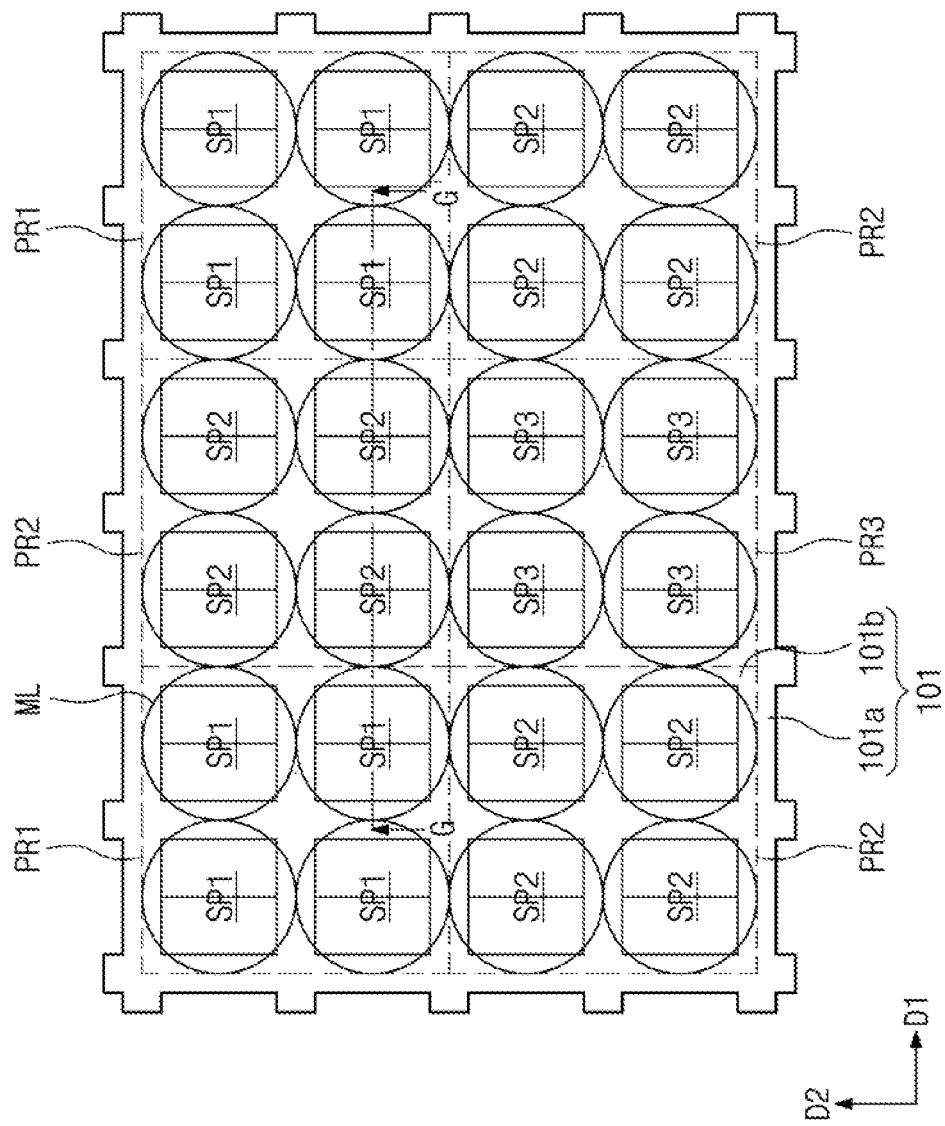
FIG. 12A illustrates a plan view partially showing an active pixel sensor array of an image sensor according to embodiments.
Figure 12B:
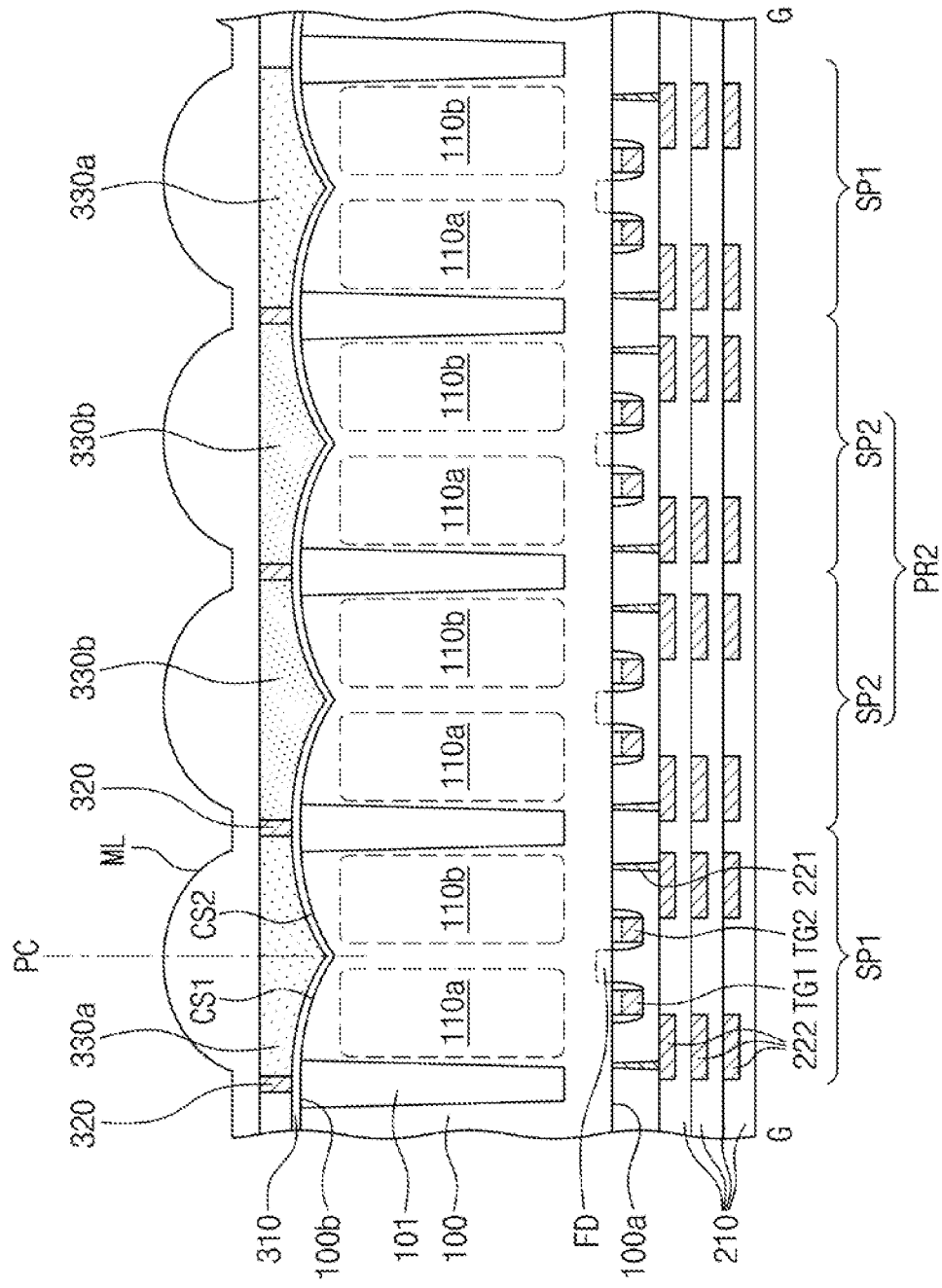
FIG. 12B illustrates a cross-sectional view taken along line G-G' of FIG. 12A, showing an image sensor according to embodiments.

FIG. 12A illustrates a plan view partially showing an active pixel sensor array of an image sensor according to embodiments. FIG. 12B illustrates a cross-sectional view taken along line G-G' of FIG. 12A, showing an image sensor according to embodiments.

Referring to FIGS. 12A and 12B, the active pixel sensor array (see APS of FIG. 3) may include a plurality of pixel regions PR1, PR2, and PR3 that are arranged in a matrix shape along the first and second directions D1 and D2. The plurality of pixel regions PR1, PR2, and PR3 may include first pixel regions PR1, second pixel regions PR2, and third pixel regions PR3, each of the first, second, and third pixel regions PR1, PR2, and PR3 may receive light whose wavelength range is different from that of light incident on other ones of the first, second, and third pixel regions PR1, PR2, and PR3.

In embodiments, the second pixel regions PR2 may each be disposed adjacent in the first and second directions D1 and D2 to the first and third pixel regions PR1 and PR3, respectively. The second pixel regions PR2 may be disposed in a diagonal direction.

The second pixel region PR2 may receive light having a first wavelength range, and the first pixel region PR1 may receive light having a second wavelength range longer than the first wavelength range. The third pixel region PR3 may receive light having a third wavelength range shorter than the first wavelength range. For example, a green light may be incident on the second pixel region PR2, a red light may be incident on the first pixel region PR1, and a blue light may be incident on the third pixel region PR3.

Each of the first, second, and third pixel regions PR1, PR2, and PR3 may include a plurality of sub-pixel regions SP1, SP2, or SP3. For example, each of the first, second, and third pixel regions PR1, PR2, and PR3 may include the sub-pixel regions SP1, SP2, or SP3 in the 2×2 arrangement. Alternatively, each of the first, second, and third pixel regions PR1, PR2, and PR3 may include the sub-pixel regions SP1, SP2, or SP3 in the 3×3 arrangement or the 4×4 arrangement.

For example, each of the first pixel regions PR1 may include a plurality of first sub-pixel regions SP1, and each of the second pixel regions PR2 may include a plurality of second sub-pixel regions SP2. Each of the third pixel regions PR3 may include a plurality of third sub-pixel regions SP3.

The first, second, and third sub-pixel regions SP1, SP2, and SP3 may have the same size and may be defined by the pixel separation structure 101. For example, neighboring second sub-pixel regions SP2 may be provided therebetween with at least two first sub-pixel regions SP1 or at least two third sub-pixel regions SP3.

As discussed above, on each of the first, second, and third sub-pixel regions SP1, SP2, and SP3, the semiconductor substrate 100 may have a first curved surface CS1 and a second curved surface CS2 that are mirror-symmetrical to each other. In addition, on each of the first, second, and third sub-pixel regions SP1, SP2, and SP3, a pair of first and second photoelectric conversion regions 110a and 110b may be provided in the semiconductor substrate 100.

First color filters 330a may be correspondingly provided on the first sub-pixel regions SP1 of the first pixel region PR1, and second color filters 330b may be correspondingly provided on the second sub-pixel regions SP2 of the second pixel region PR2. Likewise, third color filters may be correspondingly provided on the third sub-pixel regions SP3 of the third pixel region PR3. The first, second, and third color filters may include red, green, and blue color filters. Alternatively, the first, second, and third color filters may include magenta, yellow, and cyan color filters. In embodiments, three types of color filters are provided as mentioned above, but four types of color filters may be provided.

Figure 13:
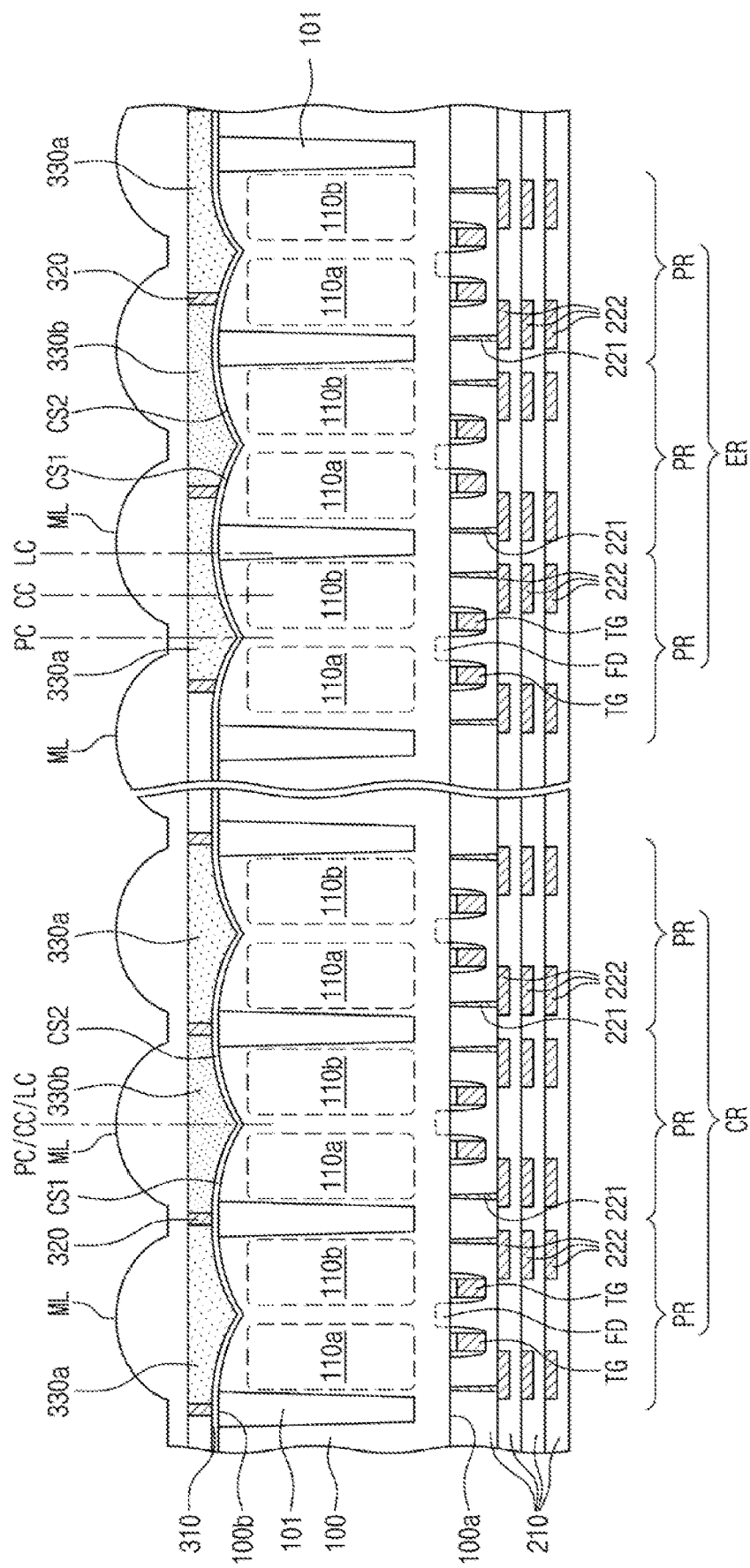
FIGS. 13 and 14 illustrate cross-sectional views showing an image sensor according to embodiments.
Figure 14:
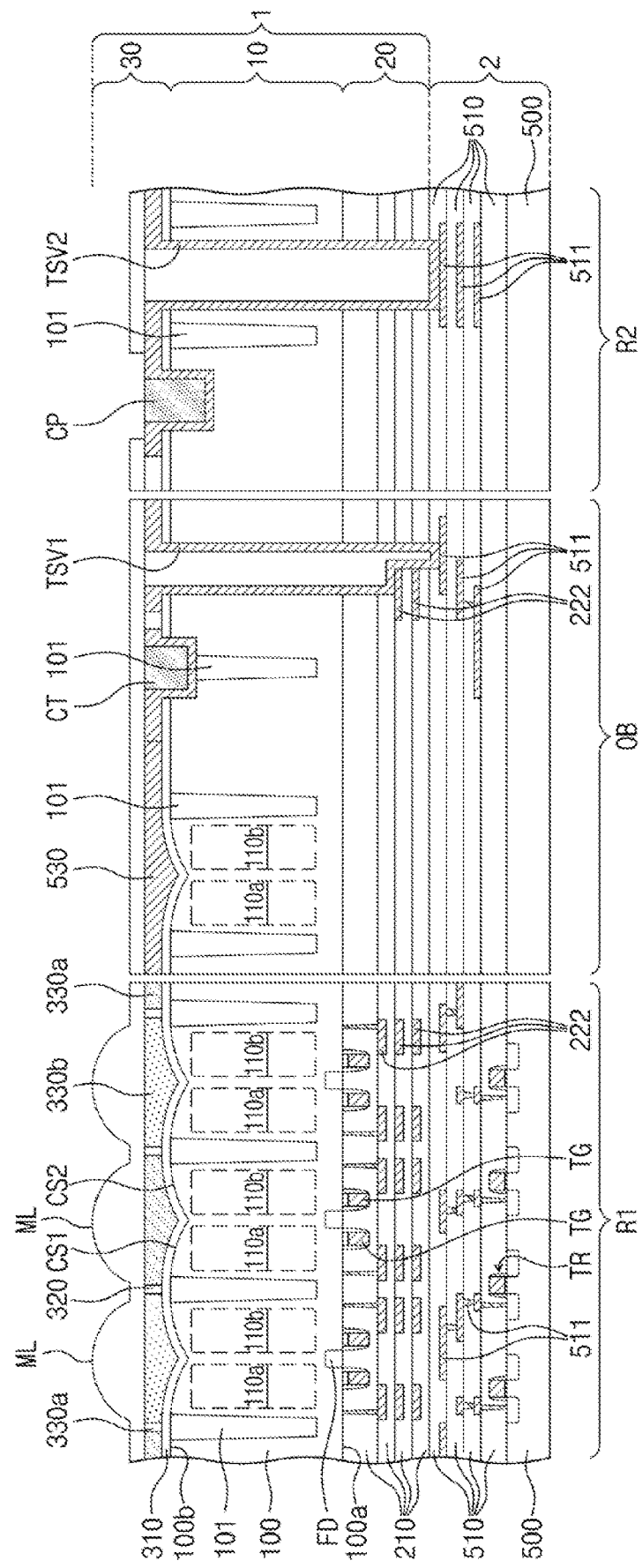

FIGS. 13 and 14 illustrate cross-sectional views showing an image sensor according to embodiments.

Referring to FIGS. 4 and 13, as discussed above, the APS array region R1 may include a central region CR and an edge region ER that surrounds the central region CR.

The semiconductor substrate 100 may include a plurality of pixel regions PR on the central and edge regions CR and ER. As discussed above, on each of the pixel regions PR, the semiconductor substrate 100 may have first and second curved surfaces CS1 and CS2 that are mirror-symmetrical to each other.

On the central region CR, the pixel center PC may agree with a micro-lens center LC.

On the edge region ER, the pixel center PC may be positioned to deviate from the micro-lens center LC. In addition, the micro-lens center LC may be positioned to deviate from a color-filter center CC.

In this configuration, on each pixel region PR, a point of contact between the first and second curved surfaces CS1 and CS2 may not vertically overlap the micro-lens center LC. For example, on the edge region ER, the micro-lens center LC may be positioned on a boundary of the pixel regions PR.

A distance between the micro-lens center LC and the pixel center PC may decrease as approaching the central region CR from the edge region ER.

Referring to FIGS. 4 and 14, an image sensor may include a sensor chip 1 and a logic chip 2.

The sensor chip 1, as discussed above, may include a photoelectric conversion layer 10, a readout circuit layer 20, and an optical transmission layer 30.

As discussed above, the photoelectric conversion layer 10 of the sensor chip 1 may include a semiconductor substrate 100, a pixel separation structure 101 that defines pixel regions PR, and first and second photoelectric conversion regions 110a and 110b that are provided on each pixel region PR.

The semiconductor substrate 100 may include an active pixel sensor (APS) array region R1, a pad region R2, and a light-shield region OB between the APS array region R1 and the pad region R2.

On the APS array region R1, the sensor chip 1 may have technical features the same as those discussed above in the image sensor 1111. For example, the pixel separation structure 101 may define a plurality of pixel regions PR, and the semiconductor substrate 100 may have first and second curved surfaces CS1 and CS2 that are mirror-symmetrical to each other on each pixel region PR.

The pixel separation structure 101 may be provided in the semiconductor substrate 100 of the light-shield region OB, and may define a reference pixel region PR. Likewise the pixel region PR, the reference pixel region PR may include first and second photoelectric conversion regions 110a and 110b, and the semiconductor substrate 100 may have first and second curved surfaces CS1 and CS2 that are mirror-symmetrical to each other.

The surface dielectric layer 310 may extend from the APS array region R1 toward the light-shield region OB and the pad region R2. On the light-shield region OB, a light-shield pattern 530 may be disposed on the surface dielectric layer 310. The light-shield pattern 530 may block incident of light onto the first and second photoelectric conversion regions 110a and 110b that are provided on the light-shield region OB.

A contact pad CT may be provided on the rear surface 100b of the semiconductor substrate 100 on the light-shield region OB. The contact pad CT may include aluminum. On the light-shield region OB, a portion of the pixel separation structure 101 may be connected through a contact plug to the contact pad CT.

On the light-shield region OB, a first through conductive pattern TSV1 may penetrate the semiconductor substrate 100, and may have electrical connection with the metal line 222 of the readout circuit layer 20 and a wiring structure 511 of the logic chip 2. The first through conductive pattern TSV1 may have a first bottom surface and a second bottom surface that are located at different levels from each other. A dielectric material may fill an inside of the first through conductive pattern TSV1.

On the pad region R2, conductive pads CP may be provided on the rear surface 100b of the semiconductor substrate 100. The conductive pads CP may include metal, such as aluminum, copper, tungsten, titanium, tantalum, or any alloy thereof. A plurality of bonding wires may be bonded to the conductive pads CP in a mounting process for the image sensor. The conductive pads CP may be electrically connected through the bonding wires to an external device.

The pixel separation structure 101 may be provided on the pad region R2 and may be disposed around the conductive pads CP. On the pad region R2, a second through conductive pattern TSV2 may penetrate the semiconductor substrate 100 and have electrical connection with the wiring structure 511 of the logic chip 2. The second through conductive pattern TSV2 may extend onto the rear surface 100b of the semiconductor substrate 100 and have electrical connection with the conductive pads CP. A portion of the second through conductive pattern TSV2 may cover bottom surfaces and sidewalls of the conductive pads CP. A dielectric material may fill an inside of the second through conductive pattern TSV2.

The logic chip 2 may include a logic semiconductor substrate 500, logic circuits TR, wiring structures 511 connected to the logic circuits TR, and logic interlayer dielectric layers 510. An uppermost one of the logic interlayer dielectric layers 510 may be coupled to the readout circuit layer 20 of the sensor chip 1. The logic chip 2 may be electrically connected to the sensor chip 1 via the first through conductive pattern TSV1 and the second through conductive pattern TSV2.

According to embodiments, on each of pixel regions, no structure may be present between first and second photoelectric conversion regions, and thus crosstalk due to scattered reflection may be reduced between the first and second photoelectric conversion regions.

Moreover, there may be a reduced difference between crosstalk of the pixel regions adjacent to each other in a first direction and crosstalk of the pixel regions adjacent to each other in a second direction. Therefore, it may be possible to decrease the occurrence of noise difference due to variation in position of the pixel regions.

When light is incident on curved surfaces that correspond to the first and second photoelectric conversion regions, the curved surfaces may split the incident light into two or more beams whose incidence directions are different depending on refractive angles, and then the split beams may be incident on the first and second photoelectric conversion regions. In such cases, signals output from the first and second photoelectric conversion regions may be compared with each other to obtain information about phase difference, which may enable an autofocus operation to adjust lens positions of camera system.

In conclusion, according to embodiments, it may be possible to improve crosstalk issues on each pixel region and to increase autofocus properties.

Although the inventive concepts have been described in connection with some example embodiments of the inventive concepts illustrated in the accompanying drawings, it will be understood to those skilled in the art that various changes and modifications may be made without departing from the technical spirit and features of the inventive concepts. It will be apparent to those skilled in the art that various substitution, modifications, and changes may be thereto without departing from the scope and spirit of the inventive concepts.

What is claimed is:

1. An image sensor comprising:
    a pixel separation structure disposed in a semiconductor substrate and defining a plurality of pixel regions;
    a first photoelectric conversion region and a second photoelectric conversion region disposed in the semiconductor substrate and in each of the plurality of pixel regions; and
    a plurality of micro-lenses disposed on the semiconductor substrate and corresponding to the plurality of pixel regions,
    wherein the semiconductor substrate comprises a plurality of curved surfaces that is convex toward the plurality of micro-lenses, and
    wherein the semiconductor substrate has a minimum thickness between the first photoelectric conversion region and the second photoelectric conversion region in each of the plurality of pixel regions, and has a maximum thickness at a boundary between the plurality of pixel regions.

2. The image sensor of claim 1, wherein a center of each of the plurality of pixel regions is between the first photoelectric conversion region and the second photoelectric conversion region, and
    a point of contact between adjacent ones of the plurality of curved surfaces of the semiconductor substrate is on the center of a respective one of the plurality of pixel regions.

3. The image sensor of claim 1, wherein, in each of the plurality of pixel regions, a thickness of the semiconductor substrate gradually increases from a center of a respective one of the plurality of pixel regions to the boundary between the plurality of pixel regions.

4. The image sensor of claim 1, wherein, in each of the plurality of pixel regions, a center of a respective one of the plurality of micro-lenses is on a point of contact between adjacent ones of the plurality of curved surfaces of the semiconductor substrate.

5. The image sensor of claim 1, wherein the pixel separation structure comprises:
    a plurality of first pixel isolation portions extending in a first direction and being spaced apart from each other; and
    a plurality of second pixel isolation portions extending across the plurality of first pixel isolation portions, extending in a second direction intersecting the first direction, and being spaced apart from each other,
    wherein, in each of the plurality of pixel regions, a point of contact between adjacent ones of the plurality of curved surfaces of the semiconductor substrate is at substantially a same distance from a pair of the plurality of first pixel isolation portions.

6. The image sensor of claim 1, further comprising a plurality of color filters interposed between the plurality of micro-lenses and the plurality of curved surfaces of the semiconductor substrate,
    wherein the plurality of color filters comprises a flat top surface and a bottom surface covering the plurality of curved surfaces.

7. The image sensor of claim 1, further comprising a separation impurity region interposed between the first photoelectric conversion region and the second photoelectric conversion region in each of the plurality of pixel regions.

8. The image sensor of claim 1, wherein the pixel separation structure comprises:
a plurality of first pixel isolation portions extending in a first direction and being spaced apart from each other; and
a plurality of second pixel isolation portions extending across the plurality of first pixel isolation portions, extending in a second direction intersecting the first direction, and being spaced apart from each other,
wherein each of the plurality of pixel regions is defined by a pair of the plurality of first pixel isolation portions and a pair of the plurality of second pixel isolation portions, and
wherein the plurality of first pixel isolation portions is correspondingly on centers of the plurality of curved surfaces of the semiconductor substrate.

9. The image sensor of claim 8, wherein the pixel separation structure further comprises a plurality of protrusions protruding along the second direction from corresponding ones of the plurality of first pixel isolation portions toward spaces interposed between the first photoelectric conversion region and the second photoelectric conversion region in each of the plurality of pixel regions.

10. The image sensor of claim 1, further comprising a third photoelectric conversion region and a fourth photoelectric conversion region disposed in the semiconductor substrate in each of the plurality of pixel regions,
wherein the plurality of pixel regions is arranged along a first direction and a second direction intersecting the first direction, and
wherein, in each of the plurality of pixel regions, a thickness of the semiconductor substrate gradually increases along the first direction and the second direction.

11. The image sensor of claim 10, wherein the pixel separation structure comprises:
a plurality of first pixel isolation portions extending in the first direction and being spaced apart from each other;
a plurality of second pixel isolation portions extending across the plurality of first pixel isolation portions, extending in the second direction intersecting the first direction, and being spaced apart from each other;
a plurality of first protrusions protruding along the second direction from corresponding ones of the plurality of first pixel isolation portions toward spaces interposed between the first photoelectric conversion region and the second photoelectric conversion region and spaces interposed between the third photoelectric conversion region and the fourth photoelectric conversion region in each of the plurality of pixel regions; and
a plurality of second protrusions protruding along the first direction from corresponding ones of the plurality of second pixel isolation portions toward spaces interposed between the first photoelectric conversion region and the third photoelectric conversion regions and spaces between the second photoelectric conversion region and the fourth photoelectric conversion region in each of the plurality of pixel regions.

* * * * *